(12) United States Patent
Takeuchi et al.

(10) Patent No.: US 7,044,586 B2
(45) Date of Patent: May 16, 2006

(54) PIEZOELECTRIC/ELECTROSTRICTIVE FILM TYPE ACTUATOR AND METHOD OF MANUFACTURING THE ACTUATOR

(75) Inventors: Yukihisa Takeuchi, Nishikamo-Gun (JP); Nobuo Takahashi, Kasugai (JP); Mutsumi Kitagawa, Inuyama (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/657,842

(22) Filed: Sep. 9, 2003

(65) Prior Publication Data

US 2004/0046481 A1 Mar. 11, 2004

Related U.S. Application Data

(63) Continuation of application No. PCT/JP02/02290, filed on Mar. 12, 2002.

(30) Foreign Application Priority Data

Mar. 12, 2001 (JP) .............................. 2001-068673
Apr. 12, 2001 (JP) .............................. 2001-114450

(51) Int. Cl.
*B41J 2/045* (2006.01)
*H04R 17/00* (2006.01)

(52) U.S. Cl. .................... 347/68; 347/71; 29/25.35
(58) Field of Classification Search ............ 347/68–72; 29/25.35, 890.1; 310/311, 324, 328
See application file for complete search history.

(56) References Cited

U.S. PATENT DOCUMENTS

| | | | |
|---|---|---|---|
| 5,210,455 A | 5/1993 | Takeuchi et al. | |
| 5,376,857 A * | 12/1994 | Takeuchi et al. | 310/328 |
| 5,592,042 A * | 1/1997 | Takuchi et al. | 310/328 |
| 5,767,612 A * | 6/1998 | Takeuchi et al. | 310/324 |
| 5,814,923 A * | 9/1998 | Shimada | 310/311 |
| 6,142,615 A * | 11/2000 | Qiu et al. | 347/70 |
| 6,174,051 B1 * | 1/2001 | Sakaida | 347/72 |
| 6,347,441 B1 * | 2/2002 | Yun et al. | 29/25.35 |
| 6,367,916 B1 * | 4/2002 | Asano | 347/69 |
| 6,437,484 B1 * | 8/2002 | Nishimura et al. | 310/324 |
| 6,441,537 B1 | 8/2002 | Takeuchi et al. | |
| 6,497,019 B1 * | 12/2002 | Yun | 29/25.35 |
| 6,504,287 B1 | 1/2003 | Yun et al. | |
| 2004/0244167 A1 | 12/2004 | Kitagawa et al. | |

FOREIGN PATENT DOCUMENTS

| | | |
|---|---|---|
| EP | 0 629 007 A1 | 12/1994 |
| EP | 1 035 595 A2 | 9/2000 |
| JP | 04-341851 A | 11/1992 |
| JP | 06-040035 | 2/1994 |
| JP | 2000-308372 A | 11/2000 |

* cited by examiner

*Primary Examiner*—An H. Do
(74) *Attorney, Agent, or Firm*—Burr & Brown

(57) ABSTRACT

A piezoelectric/electrostrictive film type actuator is provided including a ceramic substrate and a piezoelectric/electrostrictive device disposed on the ceramic substrate that is provided with a plurality of piezoelectric/electrostrictive films and electrode films. The device is driven by displacement of the piezoelectric/electrostrictive device. The piezoelectric/electrostrictive device includes a plurality of layers of piezoelectric/electrostrictive films, and the piezoelectric/electrostrictive films and electrode films are alternately laminated such that an electrode film forms an uppermost layer and a lowermost layer of the piezoelectric/electrostrictive device.

30 Claims, 13 Drawing Sheets

PIEZOELECTRIC/ELECTROSTRICTIVE FILM TYPE ACTUATOR AND METHOD OF MANUFACTURING THE ACTUATOR

CROSS REFERENCE TO RELATED APPLICATION

This application is a continuation of International Application No. PCT/JP02/02290, having an international filing date of Mar. 12, 2002, which designated the United States, the entirety of which is incorporated herein by reference.

This application also claims the benefit of Japanese Application No. 2001-068673, filed Mar. 12, 2001, and Japanese Application No. 2001-114450, filed Apr. 12, 2001, the entireties of which are incorporated herein by reference.

FIELD OF THE INVENTION

The present invention relates to a piezoelectric/electrostrictive actuator. More particularly, the present invention relates to a piezoelectric/electrostrictive film actuator which is a film type transducer for use in a displacement control device, solid device motor, ink jet head, relay, switch, shutter, pump, fin, and the like which operates based on displacement of the device, which is capable of converting mechanical and electric energies, in which the aspect ratio of a device part can more easily be increased and with which a higher-speed response and higher energy conversion efficiency are realized.

BACKGROUND OF THE INVENTION

In recent years, as one of mechanisms for raising pressure in a pressurizing chamber formed in a substrate of an actuator, a mechanism has been known in which the volume of the pressurizing chamber is changed by displacement of a piezoelectric/electrostrictive device disposed in a pressurizing chamber wall. Moreover, such a piezoelectric/electrostrictive actuator is used, for example, as an ink pump of a print head for use in an ink jet printer. When ink is supplied and the pressure in the charged pressurizing chamber is raised by the displacement of the piezoelectric/electrostrictive device, ink particles (droplets) are ejected from nozzle holes connected to the pressurizing chamber to perform printing.

For example, in JP-A-6-40035, one example of an ink jet print head using the piezoelectric/electrostrictive actuator, as shown in the accompanying FIGS. 4 and 5 and described below, is disclosed. An ink jet print head 140 is formed by bonding/integrating an ink nozzle member 142 and piezoelectric/electrostrictive film type actuator 145, and the ink supplied to a cavity 146 formed in the piezoelectric/electrostrictive film type actuator 145 is spouted through nozzle holes 154 disposed in the ink nozzle member 142.

In more detail, the piezoelectric/electrostrictive film type actuator 145 is constituted of a ceramic substrate 144 and a piezoelectric/electrostrictive device 178 integrally formed in the ceramic substrate 144. The ceramic substrate 144 is integrally formed including a structure in which a closing plate 166 and connection plate 168, each having a thin flat plate shape, are stacked via a spacer plate 170.

In the structure, a first opening for connection 172 and second opening for connection 174 are formed in the connection plate 168 in positions opposing through hole 156 and orifice hole 158, respectively, which are formed in an orifice plate 150 of the ink nozzle member 142. It is to be noted that the first opening for connection 172 has an inner diameter substantially the same as or slightly larger than that of the through hole 156. On the other hand, the diameter of the second opening for connection 174 is set to be larger than that of the orifice hole 158 by a predetermined dimension.

Moreover, a plurality of longitudinally rectangular windows 176 are formed in the spacer plate 170. Moreover, the spacer plate 170 is stacked onto the connection plate 168 so that the first opening for connection 172 and second opening for connection 174 disposed in the connection plate 168 are opened to the respective windows 176.

Furthermore, the closing plate 166 is stacked on the surface of the spacer plate 170 on the opposite side that the connection plate 168 is stacked, and the openings of the windows 176 are covered with this closing plate 166. Accordingly, a cavity 146 connected to the outside through the first and second openings for connection 172, 174 is formed in the ceramic substrate 144.

However, in the piezoelectric/electrostrictive film type actuator 145, in order to obtain a large displacement for ejecting larger droplets, it is effective to reduce the thickness of the closing plate 166 (vibration plate) or to enlarge the width of the longitudinally rectangular window 176 (cavity 146) in the short-side direction, but there is a problem that the rigidity decreases and a high-speed response is impaired.

On the other hand, the rigidity needs to be enhanced in order to obtain more superior high-speed response, and it is effective to increase the thickness of the closing plate 166 (vibration plate) or to reduce the width of the longitudinally rectangular window 176 (cavity 146) in the short-side direction, but then there is a problem that the displacement is reduced and the necessary amount of droplets cannot be ejected. That is, in the demand for a higher capability piezoelectric/electrostrictive actuator, it has been difficult to establish both a large displacement and a high-speed response only by dimensional optimization.

The present invention has been developed considering the problems of the related art and an object thereof is to provide a superior piezoelectric/electrostrictive film type actuator which can easily be highly integrated, without including a laminated structure using an adhesive, in which a larger displacement is obtained with the same driving voltage, which has a fast response speed and a large generation force, and a method of manufacturing the actuator.

SUMMARY OF THE INVENTION

That is, according to the present invention, a piezoelectric/electrostrictive film type actuator is provided, comprising a ceramic substrate, and a piezoelectric/electrostrictive device that includes one or more piezoelectric/electrostrictive films and electrode films that is disposed on the ceramic substrate. The actuator is driven by displacement of the piezoelectric/electrostrictive device. The piezoelectric/electrostrictive films and electrode films are alternately laminated such that electrode films form the uppermost and lowermost layers and such that the piezoelectric/electrostrictive device includes a plurality of piezoelectric/electrostrictive film layers. The piezoelectric/electrostrictive device preferably includes two to four piezoelectric/electrostrictive film layers.

In the piezoelectric/electrostrictive device of the piezoelectric/electrostrictive film type actuator of the present invention, the thickness $t_n$ of an n-th piezoelectric/electrostrictive film from the bottom preferably satisfies the following equation: $t_n \leq t_{n-1} \times 0.95$. The thickness per layer of each piezoelectric/electrostrictive film is preferably 30 μm or less.

In the present invention, at least one of the piezoelectric/electrostrictive film layers is preferably formed by an electrophoresis deposition method. Two or more piezoelectric/electrostrictive devices are preferably arranged on the same ceramic substrate.

In the piezoelectric/electrostrictive film type actuator, it is preferable to laminate a plurality of layers of thin plates to form the ceramic substrate when a mechanism for pressurizing a part of the wall of the cavity formed in the internal portion of the ceramic substrate is provided such that the cavity wall is deformed by the piezoelectric/electrostrictive device. More preferably, two or three thin plate layers are laminated to constitute the ceramic substrate, and the thickness of a thinner portion of the ceramic substrate is preferably 50 μm or less.

In the present invention, a material containing any of zirconium oxide, aluminum oxide, magnesium oxide, aluminum nitride, and silicon nitride as a major component can preferably be used in the ceramic substrate. Zirconium oxide, in further detail, partially stabilized zirconium oxide or completely stabilized zirconium oxide is preferable in high strength or high tenacity.

The piezoelectric/electrostrictive film type actuator of the present invention can preferably be used as an ink pump of a printer head disposed in an ink jet printer.

According to another embodiment of the present invention, a piezoelectric/electrostrictive film type actuator is provided, which comprises a ceramic substrate and a piezoelectric/electrostrictive device disposed on the ceramic substrate. The piezoelectric/electrostrictive device includes a piezoelectric/electrostrictive film and an electrode film. The ceramic substrate is provided with a cavity that is formed in the internal portion thereof, and the cavity is pressurized by deforming a part of the wall thereof with the piezoelectric/electrostrictive device. The piezoelectric/electrostrictive film type actuator is prepared by a method including the steps of preparing a green sheet laminate including at least one green sheet as a base layer and one or more green sheets having at least one hole portion formed therein, and sintering the green sheet laminate to obtain a laminated ceramic substrate. The method also includes the steps of forming an electrode film (A) on the outer surface of the obtained laminated ceramic substrate by a film forming method, forming a piezoelectric/electrostrictive film (A) on the electrode film (A) by the film forming method, forming an electrode film (B) on the piezoelectric/electrostrictive film (A) by the film forming method, and then repeating the steps of forming the piezoelectric/electrostrictive film (A) and electrode film (B) one or more times thereafter. Next, a piezoelectric/electrostrictive film (B) is formed on the electrode film (B) by the film forming method, and an electrode film (C) is then formed on the piezoelectric/electrostrictive film (B) by the film forming method. The method also includes the steps of sintering the piezoelectric/electrostrictive film(s) and/or the electrode film(s) a predetermined number of times at arbitrary times after the electrode film (A) is formed until the electrode film (C) is formed.

In the present invention, a thickness $t_n$ of the n-th formed piezoelectric/electrostrictive film formed preferably satisfies the following equation: $t_n \leq t_{n-1} \times 0.95$.

Moreover, the method includes the steps of forming and sintering the electrode film (B) at a sintering temperature Tm1(° C.) and forming and sintering the piezoelectric/electrostrictive film (B) at a sintering temperature Tm2(° C.), such that the following equation is preferably satisfied: $0 \leq Tm2 - Tm1 \leq 300$.

In the piezoelectric/electrostrictive film type actuator that is prepared by the above-described method, each of the piezoelectric/electrostrictive film and electrode film layers are subjected to a plurality of film forming methods per layer. For the film forming method, at least one thick film forming method selected from the group consisting of a screen printing method, dipping method, coating method, and electrophoresis deposition method can be used. Furthermore, as the method of forming the piezoelectric/electrostrictive film, it is preferable to use the screen printing method first time and then use electrophoresis deposition method for second and subsequent piezoelectric/electrostrictive film layers.

Moreover, in the piezoelectric/electrostrictive film type actuator prepared by the above-described method, two or three green sheets, each having at least one hole portion formed therein, are preferably laminated to form the laminated ceramic substrate.

The piezoelectric/electrostrictive film type actuator prepared by the above-described method can preferably be used as an ink pump of a printer head disposed in an ink jet printer.

According to another embodiment of the present invention, a method of manufacturing a piezoelectric/electrostrictive film type actuator is provided, wherein the piezoelectric/electrostrictive film type actuator comprises a ceramic substrate and a piezoelectric/electrostrictive device disposed on the ceramic substrate. The piezoelectric/electrostrictive device includes a piezoelectric/electrostrictive film and electrode film, and the ceramic substrate is provided with a cavity formed in the internal portion thereof that is pressurized by deforming a part of the wall thereof with the piezoelectric/electrostrictive device. The method comprises the step of preparing a green sheet laminate including at least one green sheet as a base layer and at least one green sheet having at least one hole portion is formed and sintering the green sheet laminate to obtain a laminated ceramic substrate, forming an electrode film (A) on the outer surface of the obtained ceramic laminate by a film forming method, forming a piezoelectric/electrostrictive film (A) on the electrode film (A) by the film forming method, further forming an electrode film (B) on the piezoelectric/electrostrictive film (A) by the film forming method, forming a piezoelectric/electrostrictive film (B) on the electrode film (B) by the film forming method and thereafter repeating the piezoelectric/electrostrictive film forming steps and the electrode film forming steps one or more times. The method also includes a further step of forming an electrode film (C) on the piezoelectric/electrostrictive film (B) by the film forming method. The piezoelectric/electrostrictive film(s) and/or the electrode film(s) are sintered for predetermined times at arbitrary times during the process after the electrode film (A) is formed until the electrode film (C) is formed.

In the present invention, a thickness $t_n$ of the n-th formed piezoelectric/electrostrictive film preferably satisfies the following equation: $t_n \leq t_{n-1} \times 0.95$.

Moreover, the steps of forming and sintering the electrode film (B) are performed at a sintering temperature Tm1(° C.) and the steps of forming and sintering the piezoelectric/electrostrictive film (B) are performed at a sintering temperature Tm2(° C.), such that the following equation is preferably satisfied: $0 \leq Tm2 - Tm1 \leq 300$.

In the manufacturing method of the present invention, each of the piezoelectric/electrostrictive film layers and electrode film layers can be formed by a plurality of film forming methods. For the film forming method, at least one thick film forming method selected from the group consisting of a screen printing method, dipping method, coating method, and electrophoresis deposition method can be used. Furthermore, as the method of forming the piezoelectric/electrostrictive film, it is also possible to use a screen printing method for the first layer and then use an electrophoresis deposition method for second and subsequent layers.

In the manufacturing method of the present invention, the step of preparing a green sheet laminate preferably includes providing one or a plurality of laminated green sheets form each having at least one hole portion formed therein. More preferably, two or three green sheets having at least one hole portion formed therein are laminated to form the laminated ceramic substrate.

The piezoelectric/electrostrictive film type actuator obtained by the manufacturing method of the present invention can preferably be used as an ink pump of a printer head disposed in an ink jet printer.

DETAILED DESCRIPTION OF THE INVENTION

Figure 1:
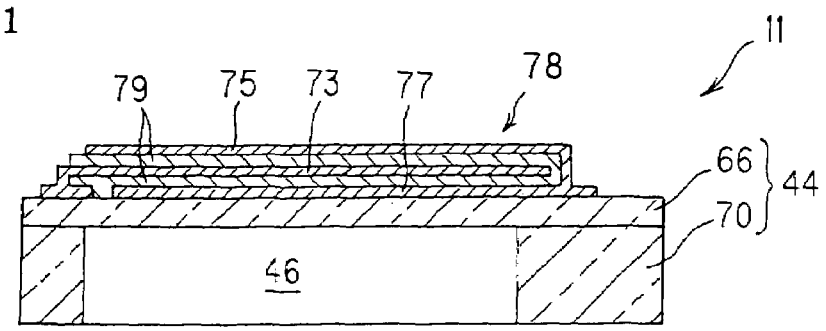
FIG. 1 is a sectional view showing an embodiment of a piezoelectric/electrostrictive film type actuator according to the present invention.

Embodiments of the piezoelectric/electrostrictive film type actuator according to the present invention will be concretely described hereinafter, but the present invention should be interpreted without being bound to these, and various changes, modifications, and improvements can be added based on knowledge of a person skilled in the art without departing from the scope of the present invention.

The present invention relates to piezoelectric/electrostrictive film type actuators which are driven by the displacement of a piezoelectric/electrostrictive device. The structure of the piezoelectric/electrostrictive film type actuator of the present invention includes a ceramic substrate and a piezoelectric/electrostrictive device disposed on the ceramic substrate. The piezoelectric/electrostrictive device is constituted of a piezoelectric/electrostrictive film and electrode film.

In the present invention, the piezoelectric/electrostrictive device has a characteristic feature in that the piezoelectric/electrostrictive film and electrode film are alternately laminated such that the electrode film forms the uppermost and lowermost layers, and preferably includes two to four piezoelectric/electrostrictive film layers. In the piezoelectric/electrostrictive film type actuator in which the piezoelectric/electrostrictive films and electrode films are laminated in layers on the ceramic substrate, a thin-film piezoelectric/electrostrictive device can be formed in which the thickness of each piezoelectric/electrostrictive film layer is thin and set, for example, to 30 μm or less. Additionally, when the films are laminated, a thick piezoelectric/electrostrictive device having a high aspect ratio can be formed. Therefore, as compared with the piezoelectric/electrostrictive device whose thickness per layer is the same and which includes only one layer of the piezoelectric/electrostrictive film, high rigidity is obtained in the portion which is bent/displaced to raise the response speed.

Moreover, since a plurality of piezoelectric/electrostrictive films are driven, a large generation force is wholly obtained. Even with the high rigidity, a relatively large displacement can be obtained. Furthermore, as compared with a piezoelectric/electrostrictive device having a total thickness that is the same, whose thickness per layer is large and which includes only one piezoelectric/electrostrictive film layer, the electric field intensity is high even with the same driving voltage, and a relatively larger displacement and generation force can be attained. Furthermore, it is easier to arrange two or more piezoelectric/electrostrictive devices on the same substrate, and high integration can be realized.

The present invention is also characterized in that the actuator is manufactured by forming the electrode film on the outer surface of a ceramic laminate, which is the substrate, by a film forming method, forming the piezoelectric/electrostrictive film on the electrode film by the film forming method, further forming the electrode film on the piezoelectric/electrostrictive film by the film forming method, and repeating the forming of these piezoelectric/electrostrictive films and electrode films preferably a plurality of times. The piezoelectric/electrostrictive film and electrode film are integrated by sintering, that is, a heat treatment. Since the method of bonding and integrating thin plates used in forming a conventional bimorph type actuator is not used, the stability for long-time use is superior, reliability is high, and the amount of displacement drift can further be suppressed. The timing for sintering the piezoelectric/electrostrictive film and electrode film is not limited, and sintering may be performed at any arbitrary time between the forming of the first electrode film and the forming of the last electrode film a desired number of times.

The present invention is further characterized in that at least the piezoelectric/electrostrictive film layer is preferably formed by an electrophoresis deposition method. When the electrophoresis deposition method is used, which includes applying an electric field to a slurry containing material particles, for example, ceramic particles to deposit the material particles in a predetermined place, it is possible to automatically form the piezoelectric/electrostrictive film on the electrode with a high density and shape precision. When a finer arrangement pattern is formed, or when a film having a higher aspect ratio is formed, mass production is possible with good precision. For example, alignment in using screen printing or preparation and management of a printing plate in accordance with a difference of sintering shrinkage of the substrate are unnecessary, the steps are saved, and man power can further be saved.

The piezoelectric/electrostrictive film type actuator of the present invention will be described hereinafter with reference to the drawings.

Figure 2:
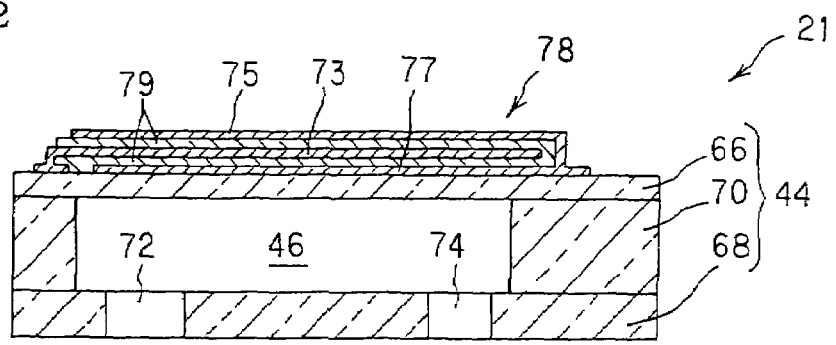
FIG. 2 is a sectional view showing another embodiment of the piezoelectric/electrostrictive film type actuator of the present invention.
Figure 3:
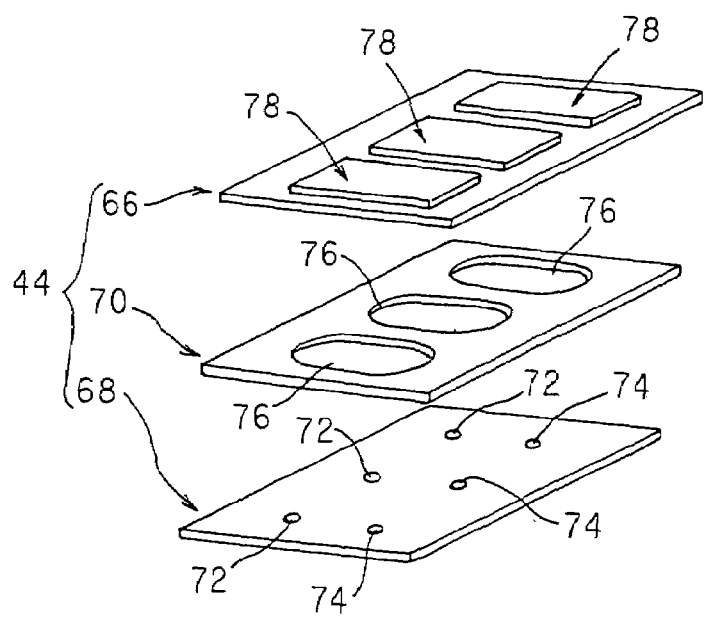
FIG. 3 is an exploded perspective view showing the structure of the piezoelectric/electrostrictive film type actuator of the present invention.
Figure 4:
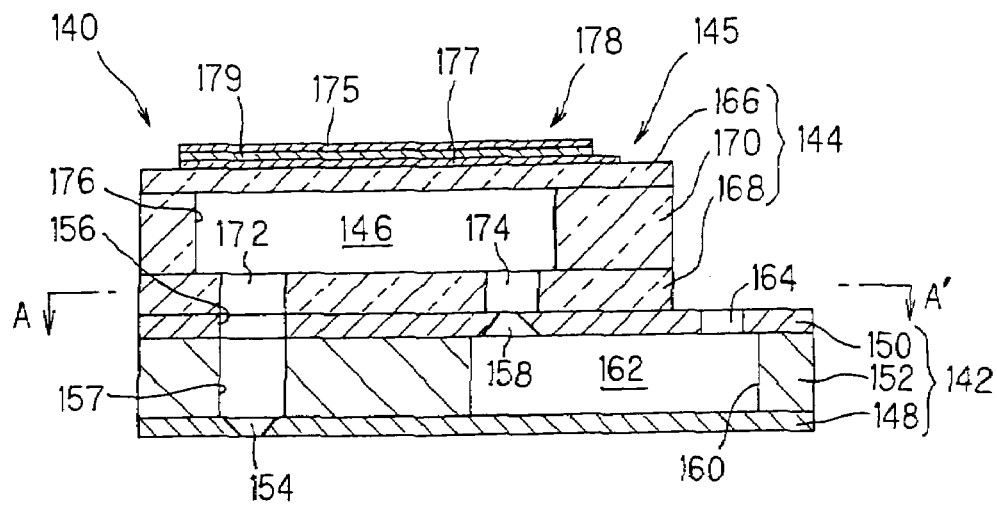
FIG. 4 is a sectional view showing an example of a conventional actuator.
Figure 5:
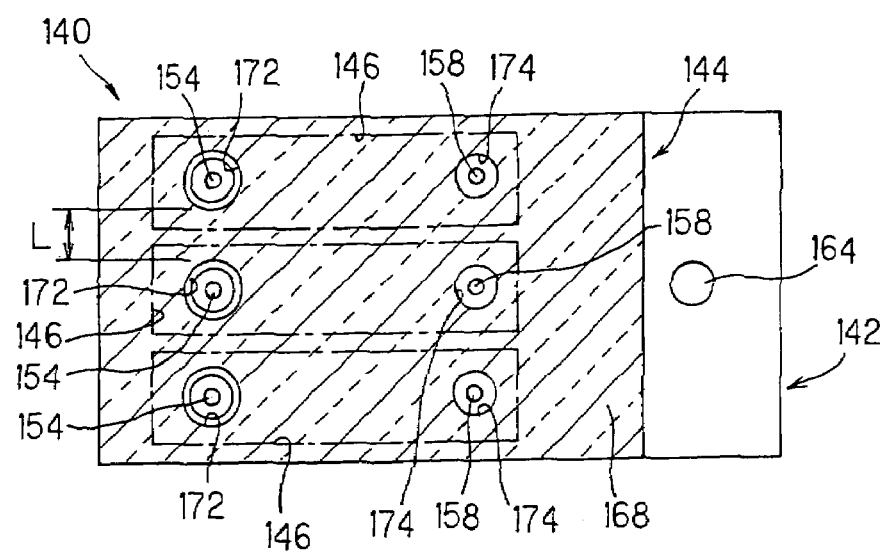
FIG. 5 is a sectional view taken through line A—A' showing another example of the conventional actuator of FIG. 4.

First, one embodiment will be described. FIGS. 1 and 2 are sectional views showing one example of an embodiment of the piezoelectric/electrostrictive film type actuator according to the present invention. FIG. 3 is an exploded perspective view showing the structure of the piezoelectric/electrostrictive film type actuator of the present invention.

The piezoelectric/electrostrictive film type actuator 21 shown in FIG. 2 is constituted of a ceramic substrate 44, and a piezoelectric/electrostrictive device 78 formed integrally with the ceramic substrate 44. The ceramic substrate 44 possesses a structure in which a closing plate 66 and connection plate 68 having thin flat plate shapes are stacked via a spacer plate 70.

Hole portions 72, 74 for connections are formed in the connection plate 68. As shown in FIG. 3, a plurality of openings 76 whose horizontally sectional shapes are essentially rectangular are formed in the spacer plate 70. Moreover, the spacer plate 70 is stacked onto the connection plate 68 so that the hole portions 72, 74 for connections open to the respective openings 76.

The closing plate 66 is stacked on the surface of the spacer plate 70 on the side opposing the surface on which the connection plate 68 is stacked, and this closing plate 66 covers the openings 76 of the spacer plate 70. In this manner, the ceramic substrate 44 includes a plurality of cavities 46 connected to the outside through the hole portions 72, 74 (as shown in FIG. 2) formed in the same ceramic substrate.

The piezoelectric/electrostrictive film type actuator 11 shown in FIG. 1 includes a structure in which the connection plate 68 is omitted from the above-described piezoelectric/electrostrictive film type actuator 21. That is, the piezoelectric/electrostrictive film type actuator 11 includes a substrate constituted by stacking two layers of thin ceramic plates, and the piezoelectric/electrostrictive film type actuator 21 includes a substrate constituted by stacking three layers of thin ceramic plates. Since the actuator is manufactured through manufacturing steps described later, a three-layer structure is more preferable, such as the piezoelectric/electrostrictive film type actuator 21, in order to enhance yield.

That is, since the green sheet that is sintered to form the substrate has flexibility, the sheet is originally difficult to handle. For example, unless a support method is carefully performed at the time the green substrate is supplied into a sintering furnace, the sheet is often distorted or broken by its own weight or is easily deformed after being sintered. Therefore, for the piezoelectric/electrostrictive film type actuator 21 with the three-layer structure including the connection plate 68, the rigidity is further enhanced in the laminated green sheets. Therefore, the actuator is easier to handle as compared with the piezoelectric/electrostrictive film type actuator 11 including the two-layer structure which does not include the connection plate 68. The generation of defective actuators caused by the handling can thus be reduced. Furthermore, even when the cavities 46 are arranged in the ceramic substrate 44 with a high density, the piezoelectric/electrostrictive film type actuator 21 including a three-layer structure with the connection plate 68 may be practically used. However, one may hardly practically use the actuator 11 possessing the two-layer structure.

In the piezoelectric/electrostrictive film type actuators 11, 21, a plurality of piezoelectric/electrostrictive devices 78 are disposed in positions, preferably, opposing the plurality of cavities 46 on the outer surface of the closing plate 66 of the above-described ceramic substrate 44. The piezoelectric/electrostrictive device 78 includes a lower electrode film 77, piezoelectric/electrostrictive film 79, intermediate electrode film 73, piezoelectric/electrostrictive film 79, and upper electrode film 75 in order from below on the closing plate 66, and is formed by the film forming method.

In the piezoelectric/electrostrictive film type actuators 11, 21 structured in this manner, when electricity is conducted between the even-numbered electrode film (lower electrode film 77 and upper electrode film 75) and the odd-numbered electrode film (intermediate electrode film 73) from below in the same manner as in the related art, an electric field function is generated in the respective piezoelectric/electrostrictive films 79. The electric field inducted strain of the piezoelectric/electrostrictive film 79 is induced based on the electric field, and flexural displacement or force generation in a vertical direction are developed in the ceramic substrate 44 because of a transverse effect.

When five layers are laminated in total, including two piezoelectric/electrostrictive film layers 79, as in the piezoelectric/electrostrictive film type actuators 11, 21, it is easy to form a so-called high aspect ratio piezoelectric/electrostrictive device having a high ratio of height in the vertical direction with respect to width in a horizontal direction. In the piezoelectric/electrostrictive device having a high aspect ratio, a high rigidity is obtained in a portion which is flexurally displaced and the response speed is raised. Since a plurality of piezoelectric/electrostrictive films are driven, a large generation force is wholly obtained. Even with the high rigidity, the relatively large displacement can be obtained.

Figure 6:
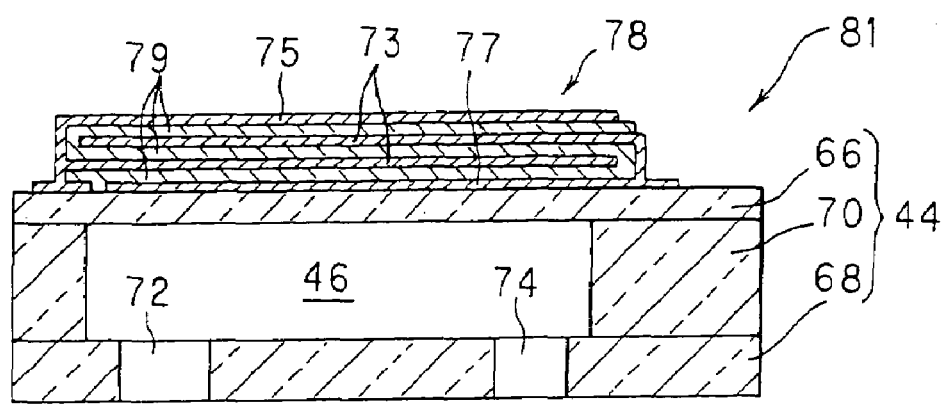
FIG. 6 is a sectional view showing still another embodiment of the piezoelectric/electrostrictive film type actuator of the present invention.
Figure 7:
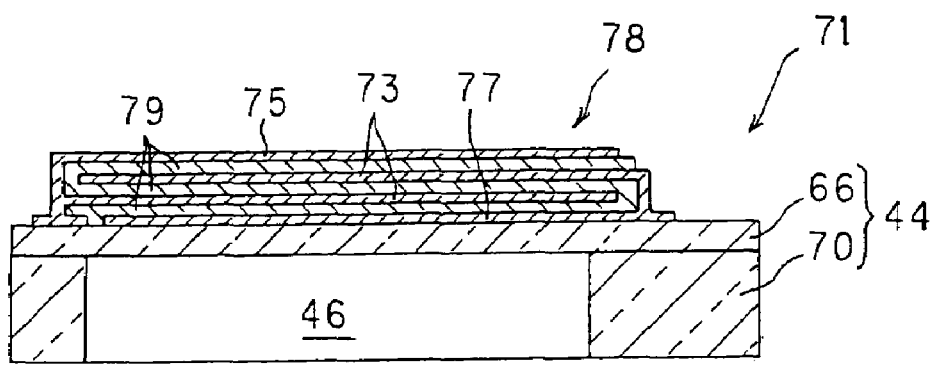
FIG. 7 is a sectional view showing still another embodiment of the piezoelectric/electrostrictive film type actuator of the present invention.

FIGS. 7 and 6 are sectional views showing another embodiment of the piezoelectric/electrostrictive film type actuator of the present invention.

The piezoelectric/electrostrictive film type actuator 71 shown in FIG. 7 includes three piezoelectric/electrostrictive film layers 79, with the addition of one layer, whereas the piezoelectric/electrostrictive device 78 of the piezoelectric/electrostrictive film type actuator 11 has two layers thereof. The piezoelectric/electrostrictive film type actuator 81 shown in FIG. 6 includes three piezoelectric/electrostrictive film layers 79, with the addition of one layer, whereas the piezoelectric/electrostrictive device 78 of the piezoelectric/electrostrictive film type actuator 21 has two layers thereof. When a piezoelectric/electrostrictive device having a higher aspect ratio is formed by laminating a total of seven layers, including three piezoelectric/electrostrictive film layers 79, a higher rigidity is obtained in the portion which is flexurally displaced, and accordingly, the response speed is increased and a larger generation force can be obtained. Even with the high rigidity, a relatively large displacement can be obtained.

FIGS. 8 to 23 are diagrams showing embodiments of a piezoelectric/electrostrictive film type actuator according to the present invention, and are seen from the short-side direction of the piezoelectric/electrostrictive film.

Figure 8:
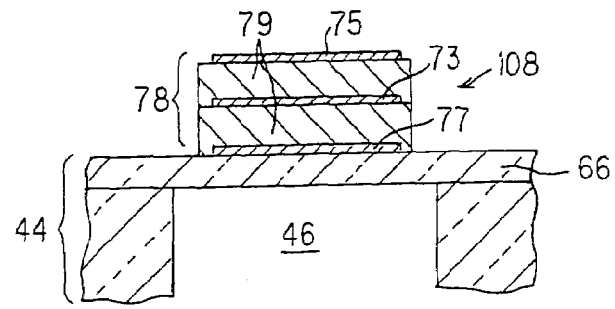
FIG. 8 is a sectional view showing one embodiment of the piezoelectric/electrostrictive film type actuator of the present invention as seen from the short-side direction of the piezoelectric/electrostrictive film.
Figure 9:
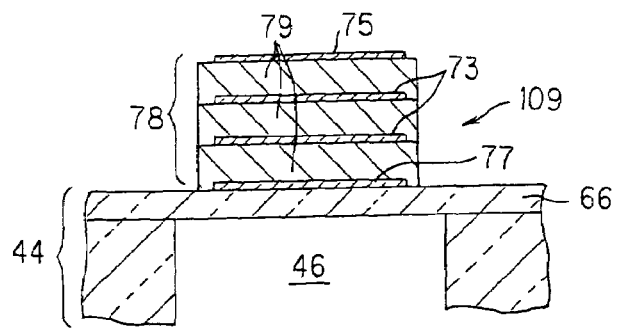
FIG. 9 is a sectional view showing another embodiment of the piezoelectric/electrostrictive film type actuator of the present invention as seen from the short-side direction of the piezoelectric/electrostrictive film.

The piezoelectric/electrostrictive film type actuator 108 shown in FIG. 8 is a piezoelectric/electrostrictive film type actuator of a standard mode in which the width of the lower electrode film 77 and piezoelectric/electrostrictive film 79 is smaller than that of the cavities 46 by 10% or more. The piezoelectric/electrostrictive film type actuator 109 shown in FIG. 9 is one having three piezoelectric/electrostrictive film layers 79 with the addition of one layer, whereas the piezoelectric/electrostrictive device 78 of the piezoelectric/electrostrictive film type actuator 108 has two layers thereof.

Figure 10:
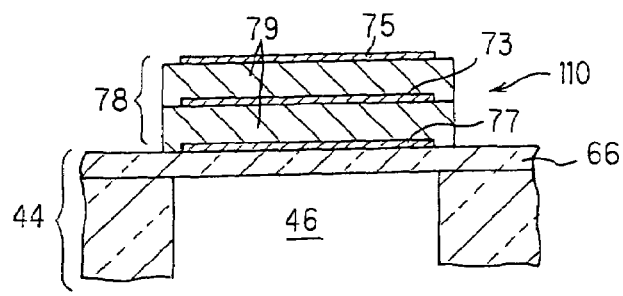
FIG. 10 is a sectional view showing still another embodiment of the piezoelectric/electrostrictive film type actuator of the present invention as seen from the short-side direction of the piezoelectric/electrostrictive film.
Figure 11:
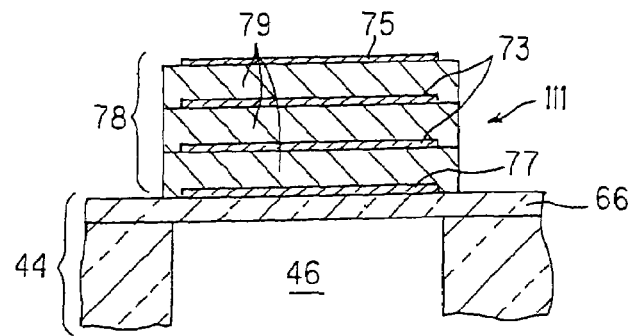
FIG. 11 is a sectional view showing still another embodiment of the piezoelectric/electrostrictive film type actuator of the present invention as seen from the short-side direction of the piezoelectric/electrostrictive film.

The piezoelectric/electrostrictive film type actuator 110 shown in FIG. 10 is a piezoelectric/electrostrictive film type actuator in which the width of the lower electrode film 77 and piezoelectric/electrostrictive film 79 is smaller than that of the cavities 46 by a small percentage. The rigidity and displacement are larger than those of the piezoelectric/electrostrictive film type actuator 108, but it is necessary to accurately position the lower electrode film at the time of manufacturing, with less productivity. The piezoelectric/electrostrictive film type actuator 111 shown in FIG. 11 is one having three piezoelectric/electrostrictive film layers 79 with the addition of one layer, whereas the piezoelectric/electrostrictive device 78 of the piezoelectric/electrostrictive film type actuator 110 has two layers thereof.

Figure 12:
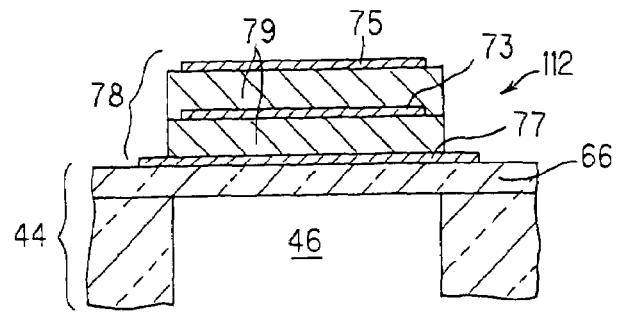
FIG. 12 is a sectional view showing still another embodiment of the piezoelectric/electrostrictive film type actuator of the present invention as seen from the short-side direction of the piezoelectric/electrostrictive film.
Figure 13:
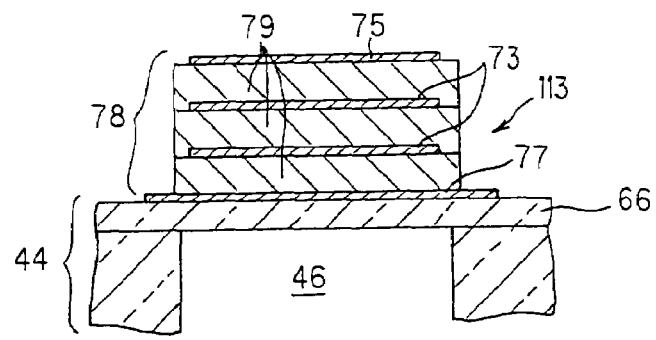
FIG. 13 is a sectional view showing still another embodiment of the piezoelectric/electrostrictive film type actuator of the present invention as seen from the short-side direction of the piezoelectric/electrostrictive film.

The piezoelectric/electrostrictive film type actuator 112 shown in FIG. 12 is a piezoelectric/electrostrictive film type actuator in which only the width of the lower electrode film 77 is larger than that of the cavity 46. The rigidity is even higher than that of the piezoelectric/electrostrictive film type actuator 110, but the displacement is slightly inferior. The piezoelectric/electrostrictive film type actuator 113 shown in FIG. 13 is one having three piezoelectric/electrostrictive film layers 79 with the addition of one layer, whereas the piezoelectric/electrostrictive device 78 of the piezoelectric/electrostrictive film type actuator 112 has two layers thereof.

Figure 14:
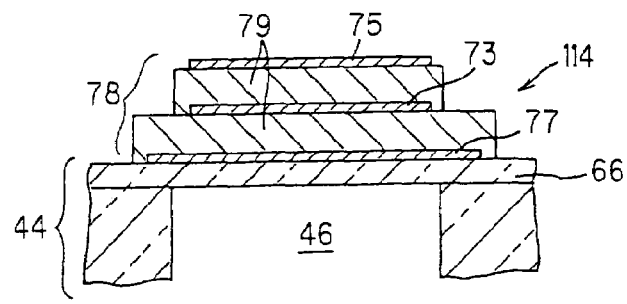
FIG. 14 is a sectional view showing still another embodiment of the piezoelectric/electrostrictive film type actuator of the present invention as seen from the short-side direction of the piezoelectric/electrostrictive film.
Figure 15:
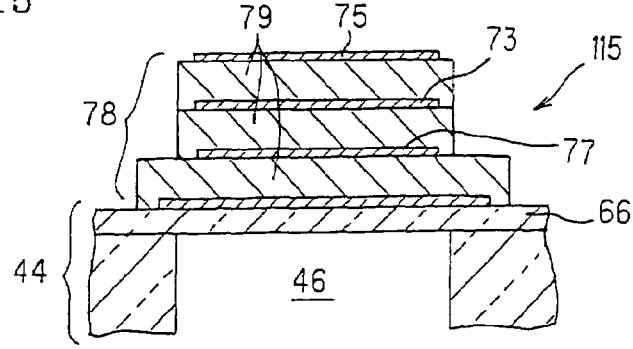
FIG. 15 is a sectional view showing still another embodiment of the piezoelectric/electrostrictive film type actuator of the present invention as seen from the short-side direction of the piezoelectric/electrostrictive film.

The piezoelectric/electrostrictive film type actuator 114 shown in FIG. 14 is a piezoelectric/electrostrictive film type actuator in which only the width of the lower electrode film 77 and the first layer of piezoelectric/electrostrictive film 79 is larger than that of the cavities 46. The rigidity is even higher than that of the piezoelectric/electrostrictive film type actuator 112, but the displacement is slightly inferior. A piezoelectric/electrostrictive film type actuator 115 shown in FIG. 15 is one having three piezoelectric/electrostrictive film layers 79 with the addition of one layer, whereas the piezoelectric/electrostrictive device 78 of the piezoelectric/electrostrictive film type actuator 114 has two layers thereof.

Figure 16:
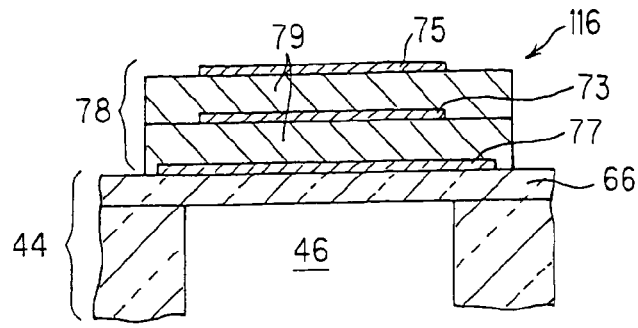
FIG. 16 is a sectional view showing still another embodiment of the piezoelectric/electrostrictive film type actuator of the present invention as seen from the short-side direction of the piezoelectric/electrostrictive film.
Figure 17:
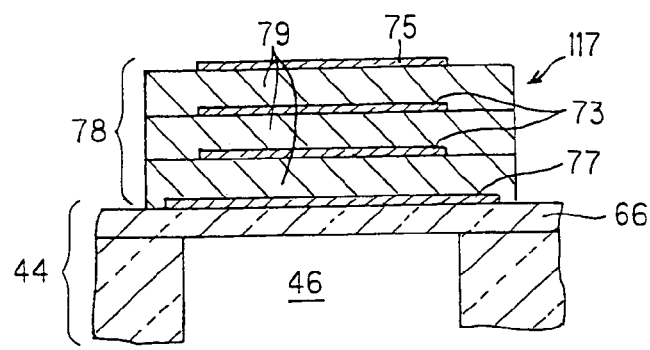
FIG. 17 is a sectional view showing still another embodiment of the piezoelectric/electrostrictive film type actuator of the present invention as seen from the short-side direction of the piezoelectric/electrostrictive film.

The piezoelectric/electrostrictive film type actuator 116 shown in FIG. 16 is a piezoelectric/electrostrictive film type actuator in which only the width of the lower electrode film 77 and piezoelectric/electrostrictive film 79 is larger than that of the cavities 46. The rigidity is further higher than that of the piezoelectric/electrostrictive film type actuator 114, but the displacement is slightly inferior. The piezoelectric/electrostrictive film type actuator 117 shown in FIG. 17 is one having three piezoelectric/electrostrictive film layers 79 with the addition of one layer, whereas the piezoelectric/electrostrictive device 78 of the piezoelectric/electrostrictive film type actuator 116 has two layers thereof.

Figure 18:
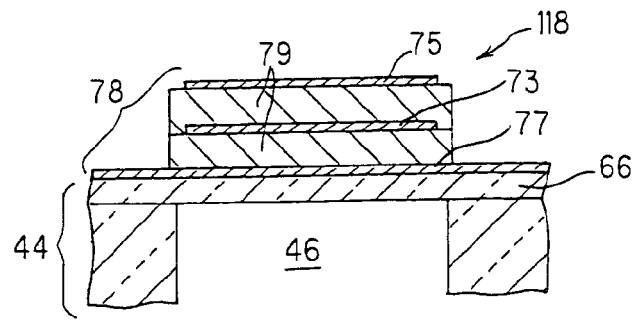
FIG. 18 is a sectional view showing still another embodiment of the piezoelectric/electrostrictive film type actuator of the present invention as seen from the short-side direction of the piezoelectric/electrostrictive film.
Figure 19:
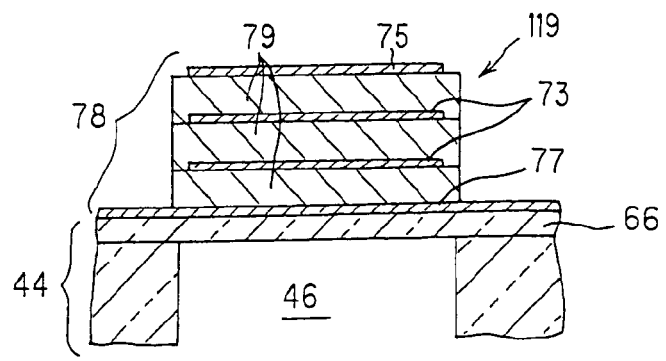
FIG. 19 is a sectional view showing still another embodiment of the piezoelectric/electrostrictive film type actuator of the present invention as seen from the short-side direction of the piezoelectric/electrostrictive film.

The piezoelectric/electrostrictive film type actuator 118 shown in FIG. 18 is a piezoelectric/electrostrictive film type actuator in which the lower electrode film 77 is connected to the adjacent electrode film, and the patterning of the lower electrode is unnecessary. The rigidity and displacement of the piezoelectric/electrostrictive film type actuator 118 are substantially equal to those of the piezoelectric/electrostrictive film type actuator 112. A piezoelectric/electrostrictive film type actuator 119 shown in FIG. 19 is one having three piezoelectric/electrostrictive film layers 79 with the addition of one layer, whereas the piezoelectric/electrostrictive device 78 of the piezoelectric/electrostrictive film type actuator 118 has two layers thereof.

Figure 20:
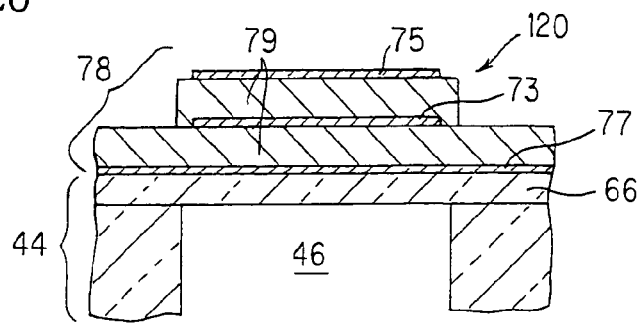
FIG. 20 is a sectional view showing still another embodiment of the piezoelectric/electrostrictive film type actuator of the present invention as seen from the short-side direction of the piezoelectric/electrostrictive film.
Figure 21:
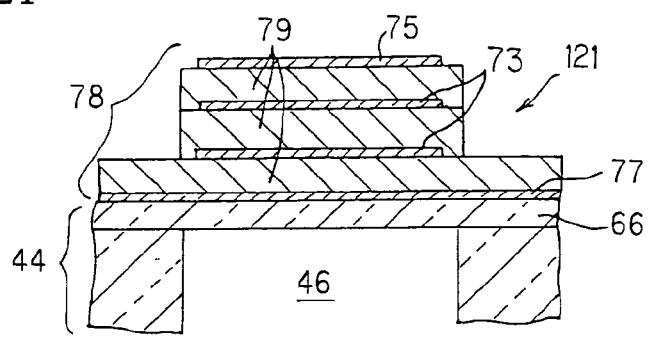
FIG. 21 is a sectional view showing still another embodiment of the piezoelectric/electrostrictive film type actuator of the present invention as seen from the short-side direction of the piezoelectric/electrostrictive film.

The piezoelectric/electrostrictive film type actuator 120 shown in FIG. 20 is a piezoelectric/electrostrictive film type actuator in which the lower electrode film 77 and the first layer of piezoelectric/electrostrictive film 79 are connected to the adjacent electrode film. The patterning of the lower electrode and the first layer of piezoelectric/electrostrictive film is unnecessary and the productivity is superior, but interference (cross talk) with the adjacent piezoelectric/electrostrictive device is still large. The rigidity is further higher than that of the piezoelectric/electrostrictive film type actuator 114, but the displacement is slightly inferior. The piezoelectric/electrostrictive film type actuator 121 shown in FIG. 21 is one having three piezoelectric/electrostrictive film layers 79 with the addition of one layer, whereas the piezoelectric/electrostrictive device 78 of the piezoelectric/electrostrictive film type actuator 120 has two layers thereof.

Figure 22:
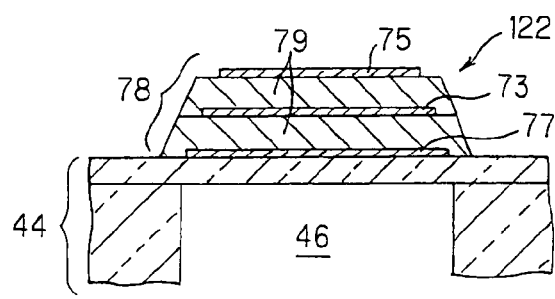
FIG. 22 is a sectional view showing still another embodiment of the piezoelectric/electrostrictive film type actuator of the present invention as seen from the short-side direction of the piezoelectric/electrostrictive film.
Figure 23:
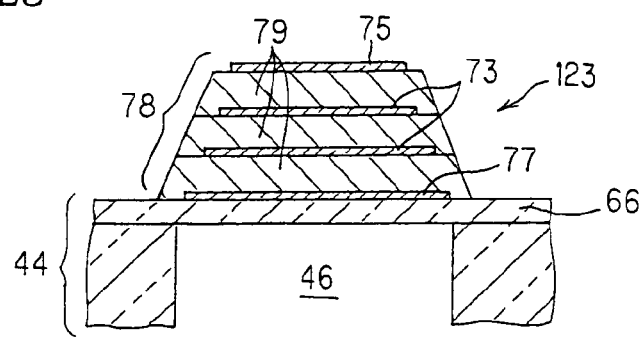
FIG. 23 is a sectional view showing still another embodiment of the piezoelectric/electrostrictive film type actuator of the present invention as seen from the short-side direction of the piezoelectric/electrostrictive film.

The piezoelectric/electrostrictive film type actuator 122 shown in FIG. 22 is a piezoelectric/electrostrictive film type actuator in which the piezoelectric/electrostrictive films 79 are stacked in a trapezoidal shape and the width of the electrode film 77 is reduced toward the upper part. There is a merit that a margin of positioning accuracy is taken and a multilayered structure is accordingly relatively easily formed. A piezoelectric/electrostrictive film type actuator 123 shown in FIG. 23 is one having three piezoelectric/electrostrictive film layers 79 with the addition of one layer, whereas the piezoelectric/electrostrictive device 78 of the piezoelectric/electrostrictive film type actuator 122 has two layers thereof.

In the piezoelectric/electrostrictive film type actuators shown in FIGS. 8 to 23 described above, the connection plate may be provided in the ceramic substrate 44, or a structure from which the connection plate is omitted may also be used. Two or more piezoelectric/electrostrictive devices 78 are usually arranged on the ceramic substrate 44.

It should also be noted that in the present invention, the shapes and arrangements of the actuator and the respective films constituting the elements of the actuator are not especially limited, and any shape or arrangement may be used in accordance with use applications. For the shapes, polygonal shapes such as triangular, quadrangular shapes and circular shapes such as circles and elliptical shapes may be used, as well as special shapes such as a lattice shape. When the application is used as an ink pump of a print head of an ink jet printer, for example, a plurality of cavities and piezoelectric/electrostrictive devices having substantially the same rectangular shape are preferably arranged at a constant interval in the same direction in the same substrate.

Moreover, in the piezoelectric/electrostrictive film type actuator of the present invention, as described above, a plurality of piezoelectric/electrostrictive devices are preferably arranged on the same ceramic substrate together with the cavity formed in the internal portion of the ceramic substrate, but the integration density is preferably as high as possible. For example, when the device is used in the application field as an ink pump of the print head of the ink jet printer, the shortest distance between the adjacent actuators is preferably 1000 μm or less. More preferably, the pitch is 500 μm or less.

Next, the shapes and materials of the respective elements constituting the piezoelectric/electrostrictive film type actuator of the present invention will individually and concretely be described.

First, the ceramic substrate will be described. In the piezoelectric/electrostrictive film type actuator 21 shown in FIG. 2, the ceramic substrate 44 is a substrate-shaped member which has flexibility, and is bent under the displacement of the piezoelectric/electrostrictive device 78 disposed on the surface. For example, the cavities 46 are deformed, and pressure fluctuation is generated in the cavities. Any shape or material of the ceramic substrate 44 is sufficient and may appropriately be selected as long as the substrate has the flexibility and mechanical strength to such an extent that the substrate does not break by bend deformation.

The plate thickness of the closing plate 66, which is the thinner portion of the ceramic substrate 44, is preferably 50 μm or less, more preferably about 3 to 12 μm. The plate thickness of the connection plate 68 is preferably 10 μm or more, more preferably 50 μm or more. Furthermore, the plate thickness of the spacer plate 70 is preferably 50 μm or more.

The shape of the ceramic substrate is not especially limited to a rectangular shape, and a circular shape, and a polygonal shape other than the quadrangular shape (and other than the triangular shape) may also be used.

Examples of ceramics used as the material constituting the ceramic substrate include zirconium oxide, aluminum oxide, magnesium oxide, aluminum nitride, and silicon nitride can preferably be used. In zirconium oxide, a material containing completely stabilized zirconium oxide as a major component and a material containing partially stabilized zirconium oxide are most preferably used because the mechanical strength is high even with small thickness, tenacity is high, and the reactivity with the materials of the piezoelectric/electrostrictive film and electrode film is small.

For completely stabilized zirconium oxide and partially stabilized zirconium oxide, the stabilized/treated oxide is preferable as follows. That is, examples of a compound for stabilizing zirconium oxide include yttrium oxide, ytterbium oxide, cerium oxide, calcium oxide, and magnesium oxide. When at least one compound is added or contained, the zirconium oxide is partially or completely stabilized. For the stabilization, it is possible to stabilize the zirconium oxide not only by the addition of one type of compound, but also by combination and addition of the compounds.

For the addition amounts of the compounds, the amount of yttrium oxide or ytterbium oxide is 1 to 30 mol %, preferably 1.5 to 10 mol %. The amount of cerium oxide is 6 to 50 mol %, preferably 8 to 20 mol %. The amount of calcium oxide or magnesium oxide is 5 to 40 mol %, preferably 5 to 20 mol %. Above all, yttrium oxide is preferably used as a stabilizer, and the amount is 1.5 to 10 mol %, further preferably 2 to 4 mol %. As additives such as a sintering aid, alumina, silica, transition metal oxide, and the like are preferably added in a range of 0.05 to 20 wt %.

In order to obtain the above-described mechanical strength and a stabilized crystalline phase, an average crystal particle diameter of zirconium oxide is desirably set to 0.05 to 3 μm, preferably 1 μm or less. For the above-described ceramic substrate, various ceramics other than zirconium oxide can also be used, but preferably substantially the same material is used to constitute the substrate. This is preferable because the reliability of the bond portion, the strength of the device, and a reduction in manufacturing intricacy are achieved.

Next, the piezoelectric/electrostrictive device will be described. The piezoelectric/electrostrictive device is constituted of at least one piezoelectric/electrostrictive film and a pair of electrode films for applying a voltage to the piezoelectric/electrostrictive film. The piezoelectric/electrostrictive film type actuator 21 shown in FIG. 3 is constituted of two piezoelectric/electrostrictive film layers 79 and the lower electrode film 77, intermediate electrode film 73, and upper electrode film 75 being disposed to sandwich the piezoelectric/electrostrictive films there-between. The device may be one constituted of at least one layer of piezoelectric/electrostrictive film, with the electrode films disposed on and under the at least one layer, however, it is preferable to manufacture a piezoelectric/electrostrictive device of such a multilayered structure that two to four layers of piezoelectric/electrostrictive films are laminated.

As a type of the piezoelectric/electrostrictive device, it is desired to employ a device that is superior in the stability of generated displacement, and advantageous in lightening of weight while the thitherto known piezoelectric/electrostrictive device can be still usable. The piezoelectric/electrostrictive device 78 laminated in the films as in the present embodiment is preferable in that respect.

As is shown by the piezoelectric/electrostrictive film type actuator 21 in FIG. 2, it is more preferable to form the piezoelectric/electrostrictive device 78 on the outer surface side of the ceramic substrate 44 because the actuator can be driven by deforming the cavity 46 to a larger extent by applying pressure and one may manufacture the device with great ease. However, the present invention is not necessarily limited to this, and the device may also be formed on an inner surface side of the cavity 46 in the ceramic substrate 44 or on the both sides thereof.

Any material of the piezoelectric/electrostrictive film may be used as long as the material causes electric field induced strains such as a piezoelectric or electrostrictive effect. The material may be either crystalline or amorphous. A semiconductor, ceramic, ferroelectric ceramic, or antiferroelectric ceramic can also be used. The material may be appropriately selected and used in accordance with the use application.

Concrete examples of suitable materials include ceramics containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, or strontium bismuth tantalite alone or in a mixture. A material containing lead zirconate titanate (PZT-system) and lead magnesium niobate (PMN-system) as the major components, or a material containing sodium bismuth titanate as the major component are preferably used, because these provide a stabilized composition having a high electromechanical coupling coefficient and piezoelectric constant and little reactivity with the ceramic substrate when the piezoelectric/electrostrictive film is sintered.

Furthermore, ceramics may also be used in which to the above-described material, one alone or a mixture of oxides such as lanthanum, calcium, strontium, molybdenum, tungsten, barium, niobium, zinc, nickel, manganese, cerium, cadmium, chromium, cobalt, antimony, iron, yttrium, tantalum, lithium, bismuth, and tin is added. For example, when lead zirconate, lead titanate, and lead magnesium niobate as the major components contain lanthanum or strontium, anti-electric field or piezoelectric property can be adjusted, and other advantages are sometimes obtained.

The thickness of each piezoelectric/electrostrictive film is preferably thin so that a large displacement can be attained with a smaller voltage, and is preferably 100 μm or less. More preferably, the thickness is about 3 to 30 μm. When a plurality of piezoelectric/electrostrictive films are laminated in the piezoelectric/electrostrictive device of the piezoelectric/electrostrictive film type actuator, the films are preferably gradually thinned and formed, and are preferably formed so that a thickness $t_n$ of the n-th piezoelectric/electrostrictive film from the bottom satisfies the following equation: $t_n \leq t_{n-1} \times 0.95$.

This is because the strain amount of the piezoelectric/electrostrictive film is larger as the applied electric field is higher, that is, as the thickness of the piezoelectric/electrostrictive film is smaller with the same driving voltage. When the piezoelectric/electrostrictive film formed in an upper part is set to have a larger distortion than the piezoelectric/electrostrictive film formed in a lower part, the bending efficiency can be raised, and the flexural displacement can more effectively be developed.

For the piezoelectric/electrostrictive film for use in the piezoelectric/electrostrictive film type actuators 11, 21, 71, 81 of the present invention shown in FIGS. 1, 2, 6, and 7, from demanded actuator characteristics, the film preferably has a piezoelectric constant $|d_{31}|$ of $50 \times 10^{-12}$ m/V or more. It is more preferable that the piezoelectric/electrostrictive film has a $|d_{31}|$ of $100 \times 10^{-12}$ m/V or more.

The material of the electrode film of the piezoelectric/electrostrictive device is preferably constituted of a metal which is solid at room temperature and which can bear a high-temperature oxidizing atmosphere around the sintering temperature described in the manufacturing steps described below and which has superior conductivity. Examples of this material include aluminum, titanium, chromium, iron, cobalt, nickel, copper, zinc, niobium, molybdenum, ruthenium, palladium, rhodium, silver, tin, tantalum, tungsten, iridium, platinum, gold, lead, and another simple metal or an alloy of these. Furthermore, a cermet material including the same material as that of the piezoelectric/electrostrictive film or the ceramic substrate dispersed in the metal may also be used.

The selection of the material of the electrode film in the piezoelectric/electrostrictive device sometimes depends on the method of forming the piezoelectric/electrostrictive film. For example, in the piezoelectric/electrostrictive film type actuator 21 of the present invention shown in FIG. 2, when the piezoelectric/electrostrictive film 79 is sintered and formed on the electrode film 77 after forming the lower electrode film 77 on the ceramic substrate 44, the electrode film 77 requires the use of high-melting metals, such as platinum, which do not change even at the sintering temperature of the piezoelectric/electrostrictive film 79. However, after forming the piezoelectric/electrostrictive film 79, the electrode film can be formed in the upper electrode film 75 formed on the piezoelectric/electrostrictive film 79 at a low temperature. Therefore, it is also possible to use low-melting metals such as aluminum, gold, and silver.

The thickness of the electrode film is a considerable factor in the decrease in the displacement of the piezoelectric/electrostrictive device. Therefore, in the piezoelectric/electrostrictive film type actuator 21 of the present invention shown in FIG. 2, especially when the upper electrode film 75 and intermediate electrode film 73 are formed after forming the piezoelectric/electrostrictive film, it is preferable to use materials of organic metal pastes to obtain a dense and thinner film after the sintering, such as a gold resinate paste, platinum resinate paste, and silver resinate paste.

The thickness of the electrode film is preferably small in order to secure the displacement amount for driving the film as the actuator. The thickness is usually designed to be 15 μm or less, more preferably 5 μm or less. Therefore, for example, in the piezoelectric/electrostrictive film type actuators 11, 21 shown in FIGS. 1 and 2, the film thickness of the piezoelectric/electrostrictive device 78 including five layers in total is set to preferably approximately 240 μm or less, more preferably 70 μm or less.

Figure 24:
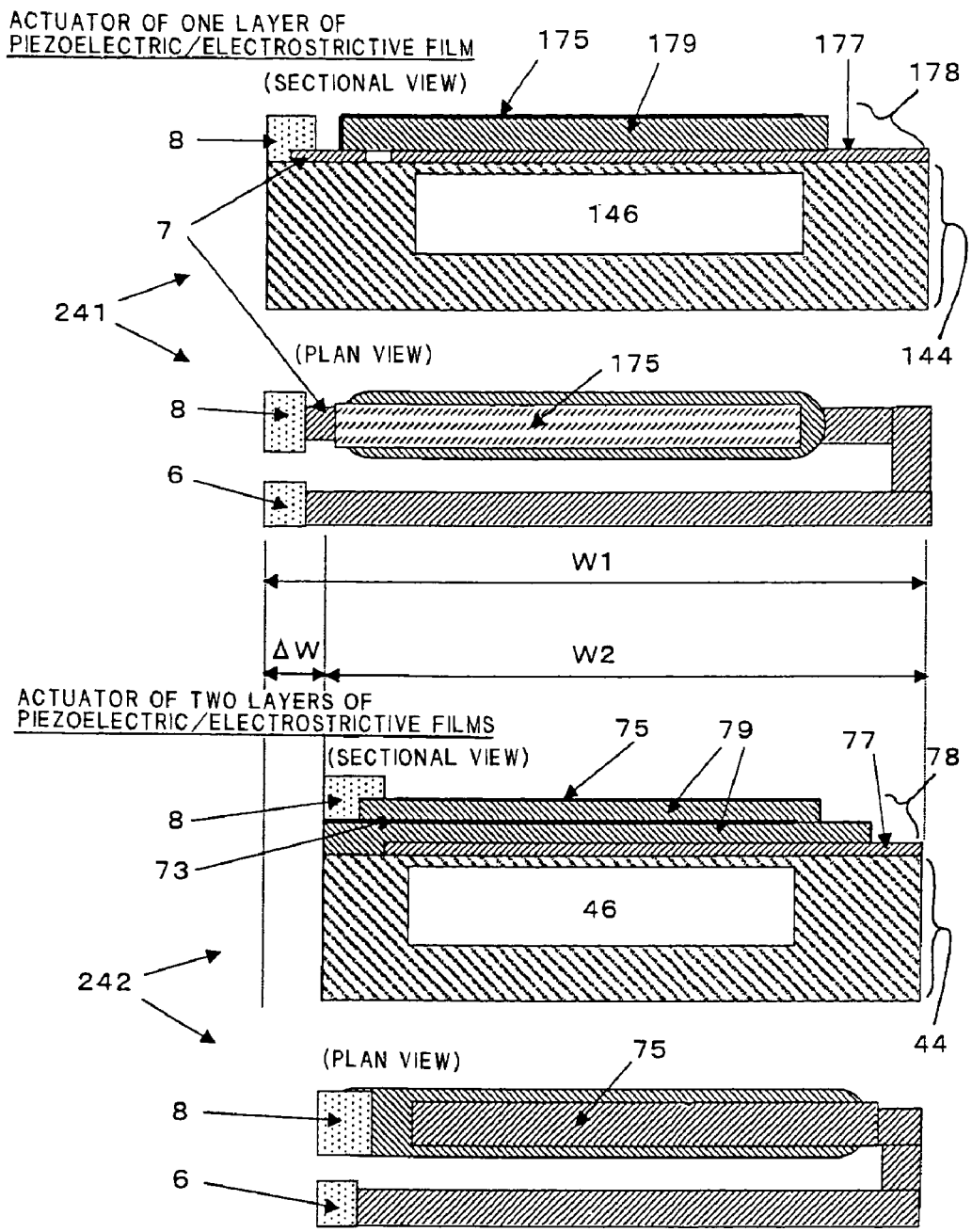
FIG. 24 is a diagram showing the embodiment of the piezoelectric/electrostrictive film type actuator, and shows a sectional view and plan view of a conventional actuator including one layer of the piezoelectric/electrostrictive film and an actuator including two layers of the piezoelectric/electrostrictive films according to the present invention.

Next, an electrode including a terminal electrode for applying voltage to the piezoelectric/electrostrictive device of the piezoelectric/electrostrictive film type actuator according to the present invention will be described with reference to the accompanying drawings. FIG. 24 is a diagram showing an embodiment of the piezoelectric/electrostrictive film type actuator, and shows a sectional view and plan view indicating the difference in sizes between a conventional actuator including one piezoelectric/electrostrictive film layer and an actuator including two piezoelectric/electrostrictive film layers according to the present invention.

First, a conventional piezoelectric/electrostrictive film type actuator 241 including one piezoelectric/electrostrictive film layer will be described. The piezoelectric/electrostrictive film type actuator 241 includes the ceramic substrate 144 and the piezoelectric/electrostrictive device 178 disposed in a position opposite to the cavity 146. The piezoelectric/electrostrictive device 178 includes a lower electrode film 177, piezoelectric/electrostrictive film 179, and upper electrode film 175 formed in order from a ceramic substrate 144 side by the film forming method. A terminal electrode 6 is disposed with respect to the lower electrode film 177. For the upper electrode film 175, a terminal electrode 8 is disposed on the ceramic substrate 144 via an auxiliary electrode 7 disposed to be insulated from the lower electrode film 177. The piezoelectric/electrostrictive device 178 is driven by applying the voltage through the terminal electrodes 6, 8. The lower electrode film 177 and upper electrode film 175 are electrically conducted, the electric field function is generated in the piezoelectric/electrostrictive film 179 to induce the electric field inductive strain, and the flexural displacement or generation force is developed in the ceramic substrate 144.

A reason why the upper electrode film 175 is connected to the terminal electrode 8 via the auxiliary electrode 7 is that further inexpensive silver is used in the material of the terminal electrode, and gold is frequently used in the upper electrode film 175 as described above. Therefore, when the heat treatment such as sintering is performed in a contact state of the terminal electrode 8 with the upper electrode film 175, gold ions in a contact portion diffuse into the silver and disappear, causing a disconnection. To solve the problem, an auxiliary electrode 7 formed of platinum is used as an intermediary, and the gold ions of the upper electrode film 175 are prevented from being diffused into the silver of the terminal electrode 8 and causing such a disconnection.

However, as compared with the direct connection of the upper electrode film 175 to the terminal electrode 8, there is a problem that the auxiliary electrode 7 is relayed and the area per chip of the piezoelectric/electrostrictive film type actuator 241 is enlarged by the region of the electrode. It is to be noted that when the material of the terminal electrode 8 is platinum, the auxiliary electrode 7 is unnecessary. However, platinum is expensive compared to silver, bad in solder wettability, and therefore unfavorable.

Similarly, according to a piezoelectric/electrostrictive film type actuator 242 including two layers of piezoelectric/electrostrictive films according to the present invention shown in FIG. 24, the above-described problem is solved as described hereinafter, and the area per chip of the actuator can further be reduced.

The piezoelectric/electrostrictive film type actuator 242 includes the ceramic substrate 44, and the piezoelectric/electrostrictive device 78 disposed in the position opposite to the cavity 46. The piezoelectric/electrostrictive device 78 includes the lower electrode film 77, piezoelectric/electrostrictive film 79, intermediate electrode film 73, piezoelectric/electrostrictive film 79, and upper electrode film 75 formed, respectively, in order from the ceramic substrate 44 side by the film forming method. In the piezoelectric/electrostrictive film type actuator 242, when electricity is supplied between the lower electrode film 77 and upper electrode film 75 and the intermediate electrode film 73, the electric field function is generated in the respective piezoelectric/electrostrictive films 79 and the electric field inductive strain is induced. The flexural displacement and generation force in the vertical direction can be developed in the ceramic substrate 44. Therefore, the lower electrode film 77 is connected to the upper electrode film 75, the conducted terminal electrode 6 is disposed, the intermediate electrode film 73 is connected to the terminal electrode 8, and the voltage is applied through the terminal electrodes 6, 8. The terminal electrode 6 may be aligned with or disposed opposing the terminal electrode 8 as shown. However, in order to increase the reliability of the bond with the piezoelectric/electrostrictive device 78, it is preferable to dispose the electrodes independently of the piezoelectric/electrostrictive device 78 without forming the electrodes on the cavity 46 which is displaced.

In the intermediate electrode film 73, from the demanded heat resistance, a material such as platinum and palladium is used in which disconnection is not easily caused by diffusion and disappearance of the gold ions at the heat treatment time. Therefore, as a result, the intermediate electrode film 73 can be directly connected to the terminal electrode 8 without any auxiliary electrode. Therefore, the area which has been required for relaying the electrode film and terminal electrode in the piezoelectric/electrostrictive film type actuator 241 is unnecessary. As shown in one example in FIG. 24, with respect to a width W1 of the piezoelectric/electrostrictive film type actuator 241 in a longitudinal direction, the piezoelectric/electrostrictive film type actuator 242 has a width W2 in the longitudinal direction, and the width can be reduced by ΔW.

It is to be noted that to maximize this effect, a piezoelectric/electrostrictive film 79 end heretofore stopped in a position slightly projecting from a cavity 46 end is enlarged and formed up to a ceramic substrate 44 end, and the terminal electrode 8 is preferably formed on the intermediate electrode film 73 extended onto the end. In this case, when one chip of the piezoelectric/electrostrictive film type actuator is cut out, a portion of the piezoelectric/electrostrictive film 79 formed on the ceramic substrate 44 is cut. Unless the ceramic substrate 44 is firmly bonded to the piezoelectric/electrostrictive film 79 in an interface, interface peel possibly occurs by shock of cut processing.

Figure 25:
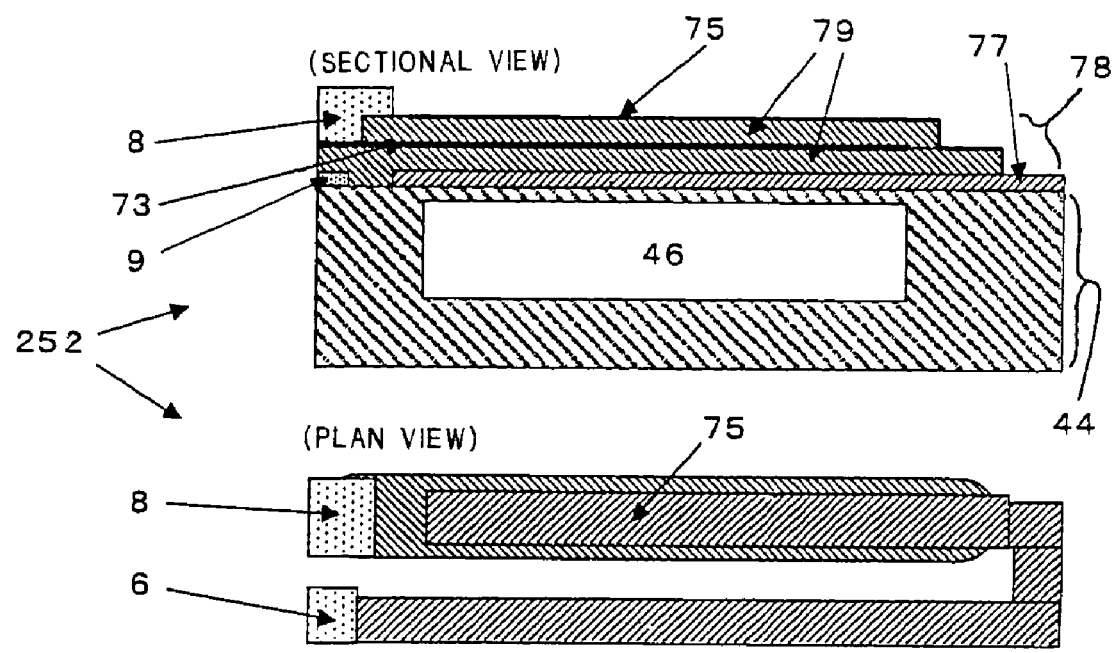
FIG. 25 is a diagram showing another embodiment of the piezoelectric/electrostrictive film type actuator, and shows a sectional view and plan view of the actuator including two layers of the piezoelectric/electrostrictive films according to the present invention.
Figure 26:
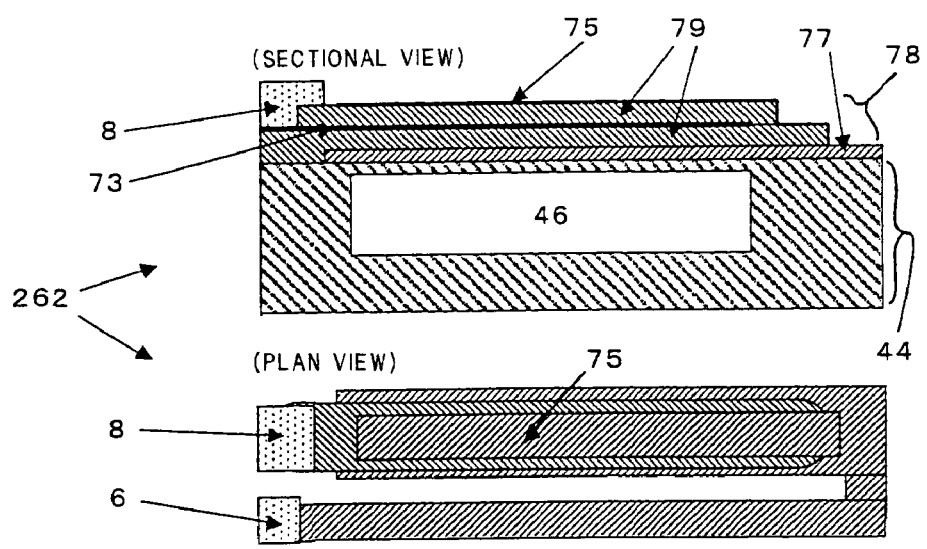
FIG. 26 is a diagram showing still another embodiment of the piezoelectric/electrostrictive film type actuator, and shows a sectional view and plan view of the actuator including two layers of the piezoelectric/electrostrictive films according to the present invention.

A piezoelectric/electrostrictive film type actuator of a more preferable mode including a countermeasure against this will be described hereinafter with reference to the drawings. FIGS. 25 and 26 are diagrams showing another embodiment of the piezoelectric/electrostrictive film type actuator, and show a sectional view and plan view of the actuator including two layers of the piezoelectric/electrostrictive films according to the present invention.

In a piezoelectric/electrostrictive film type actuator 252 shown in FIG. 25, in a portion planned to be cut on the ceramic substrate 44, a bond layer 9 is formed to firmly bond the ceramic substrate 44 to the piezoelectric/electrostrictive film 79. As the bond layer 9, for example, a material equal to that of the lower electrode film 77, such as platinum and palladium, or lead zirconate titanate containing a glass component is preferable.

Moreover, in a piezoelectric/electrostrictive film type actuator 262 shown in FIG. 26, as the material of the piezoelectric/electrostrictive film 79, lead zirconate titanate is used which is of a composition base having high reactivity with the material of the ceramic substrate 44. Additionally, at this time, when the ceramic substrate 44 reacts with the piezoelectric/electrostrictive film 79 in the upper surface of the cavity 46, strength unfavorably drops in a part of the wall of the cavity 46 deformed under the displacement of the piezoelectric/electrostrictive device 78. Therefore, in the piezoelectric/electrostrictive film type actuator 262, the whole surface above the cavity 46 of the ceramic substrate 44 is coated with the lower electrode film 77, so that the piezoelectric/electrostrictive film 79 is preferably prevented from directly contacting the ceramic substrate 44 on the cavity 46.

Subsequently, a method of manufacturing the piezoelectric/electrostrictive film type actuator of the present invention will be described.

In the actuator of the present invention, the constituting material of each member is ceramic, and each constituting element of the actuator is preferably manufactured with respect to the ceramic substrate using a green sheet laminate method. On the other hand, with respect to the piezoelectric/electrostrictive device, the actuator is preferably manufactured using a thin or thick film forming method. According to the green sheet laminate method in which the ceramic substrate of the piezoelectric/electrostrictive film type actuator can integrally be molded, a state change of the bond portion of each member with an elapse of time hardly occurs. Therefore, this is a method high in the reliability of the bond portion and easy in the securing of the rigidity. In the piezoelectric/electrostrictive film type actuator of the present invention, the bond reliability between the ceramic substrate and the piezoelectric/electrostrictive device is a very important point which influences the characteristics of the actuator. Since the present manufacturing method is superior in productivity and moldability, the actuator having a predetermined shape can also be prepared in a short time and with good reproducibility.

First, the manufacturing method of the laminated ceramic substrate will be described. A binder, solvent, dispersant, plasticizer, and the like are added to/mixed with ceramic powder of zirconium oxide to prepare slurry. After a defoaming treatment, a green sheet having a predetermined thickness is prepared by methods such as a reverse roll coater method and doctor blade method. Moreover, the green sheet is processed in various desired shapes by methods such as punching using a metal mold and laser processing.

For example, in the piezoelectric/electrostrictive film type actuator 21 shown in FIG. 3, there are prepared a green sheet A mainly forming the closing plate 66 after the sintering, a green sheet B in which at least one rectangular opening 76 is formed and which is sintered to form the spacer plate 70, and a green sheet C in which at least one hole portion for connection 72, 74 is formed and which is sintered to form the connection plate 68. All the shapes of the openings 76 do not have to be the same, and are determined in accordance with the desired functions. As long as the hole portions 72, 74 for connections are connected to the outside space, the shapes of the hole portions 72, 74 for connections are not especially limited. For example, with the use as the ink pump of the printer head of the ink jet printer, as shown in FIG. 3, hole portions whose opening sections are substantially circular are formed to individually connect each of the hole portions for connection 72, 74 to the outside space.

When one row of or more openings 76 are formed to be juxtaposed in the green sheet B, a plurality of actuators can be obtained at once. These green sheets A, B, C are prepared beforehand, at least two green sheets A, C constituting the substrate and at least one green sheet B in which at least one opening 76 is formed are used to laminate at least one green sheet B in which at least one opening 76 is formed, for example, between the green sheets A and C, and the green sheet laminate may be prepared. Needless to say, in preparing the green sheet laminate, in detail a laminate order of the green sheets A, C and the green sheet B in which at least one hole portion is formed, there is not especially a limitation. The sheets can usually be laminated in an arbitrary order as long as the laminate does not affect the subsequent steps.

For example, a method of pressing and obtaining a ceramic green laminate after successively stacking the green sheets A, B, C may also be used, or a method of stacking the green sheets A, B to press and obtain an integrated material and stacking the green sheet C on the integrated material to press and obtain the green sheet laminate may also be used. For the pressing, when heat is added, laminate properties can advantageously be enhanced. When the paste, slurry, and the like mainly containing the ceramic powder and binder are applied or printed onto the green sheet to form a bond auxiliary layer, the laminate properties of the green sheet interface can preferably be enhanced. For the above-described ceramic powder, the same or similar composition as that of ceramic used in the green sheet is preferable in securing the reliability.

These are described only as an illustration, and all the manufacturing methods of the present invention are not described. For example, even when the number of laminates is four or more, the pressing frequency or order is not especially limited, and the method of preparing the green sheet laminate is not limited to these.

The obtained green sheet laminate is sintered to obtain a ceramic laminate. The green sheet laminate is sintered at a temperature of about 1200 to 1600° C., but the ceramic laminate obtained by sintering sometimes includes unintended warpage. In this case, at a temperature close to the sintering temperature, a weight is preferably laid on the laminate to re-sinter (hereinafter referred to also as warp correction) and flatten the laminate. In this warp correction, a porous ceramic plate, such as flat alumina, is preferably used as the weight. The warp correction is performed after the sintering. Alternatively, a method of laying the weight beforehand at the sintering time and flatting the laminate simultaneously with the sintering is also preferable.

It is to be noted that a procedure of forming the piezoelectric/electrostrictive device on the green sheet laminate by the film forming method described later without sintering the green sheet laminate, and thereafter performing the sintering, may also be used. However, when the laminate is sintered beforehand to form the ceramic laminate before forming the piezoelectric/electrostrictive device, dimensional accuracy is further enhanced, and warping of the piezoelectric/electrostrictive device can preferably be inhibited.

Subsequently, the manufacturing method of the piezoelectric/electrostrictive device will be described. In the manufacturing method of the present invention, the piezoelectric/electrostrictive device can be formed on the surface of the ceramic laminate by thick film forming methods such as a screen print method, dipping method, coating method, and electrophoresis deposition method, or by thin film methods, such as an ion beam method, sputtering method, vacuum deposition, ion plating method, chemical vapor phase deposition method (CVD), and plating. Moreover, one layer is preferably subjected to the above-described film forming method not only once but also a plurality of times to form the piezoelectric/electrostrictive film and electrode film constituting the piezoelectric/electrostrictive device.

When the piezoelectric/electrostrictive device is formed by the film forming method in this manner, it is possible to integrally bond and dispose the piezoelectric/electrostrictive device and ceramic substrate without using any adhesive, the reliability and reproducibility can be secured, and the integration can easily be performed. Additionally, in the manufacturing method of the present invention, the piezoelectric/electrostrictive film is preferably formed by the thick film forming method. According to these methods, a paste, slurry, suspension, emulsion, or sol containing piezoelectric ceramic particles having an average particle diameter of 0.01 to 5 μm, preferably 0.35 to 3 μm as the major component can be used to form the piezoelectric/electrostrictive film, and satisfactory operation characteristics are obtained.

The electrophoresis deposition method has an advantage in that the films can be formed with a high density and high shape accuracy, and is preferable in forming the piezoelectric/electrostrictive film. Moreover, the method has the characteristics as described in technical document "DENKI KAGAKU," 53, No. 1 (1985) P63 to P68, authored by Kazuo ANZAI. Therefore, the method may appropriately be selected and used considering the demanded accuracy and reliability. As a preferable condition in the electrophoresis deposition method, as disclosed, for example, in JP-A-6-63914, a method of dispersing material particles of ceramic in a solvent to which a phosphoric ester based surface active agent has been added to obtain a slurry having a high solid content concentration is known in order to prepare the slurry which is an object to be electrophoresed. According to the electrophoresis deposition method using such a slurry, the film can be formed even if the voltage is not high, such that the actuator can be manufactured at a lower cost.

On the other hand, the screen print method is still preferably used as the manufacturing method of the present invention, because the film can be formed simultaneously with the forming of the electrode pattern.

In the present invention, as the method of forming the piezoelectric/electrostrictive film in the piezoelectric/electrostrictive device, for example, a method of using the screen print method first time and using electrophoresis deposition for second and subsequent times is also preferably used.

More concretely, the present invention will be described by the piezoelectric/electrostrictive film type actuator 21 of the present invention shown in FIG. 2. After sintering the green sheet laminate on a predetermined condition, preferably at a temperature of 1200° C. to 1600° C., the lower electrode film 77 is printed in the predetermined position of the surface of the obtained ceramic laminate, and sintered preferably at a temperature of 1250° C. to 1450° C. Subsequently, the piezoelectric/electrostrictive film 79 is printed, and further the intermediate electrode film 73 is printed and sintered preferably at a temperature lower than the sintering temperature of the piezoelectric/electrostrictive film 79 to be printed next by 0° C. to 300° C. Furthermore, the piezoelectric/electrostrictive film 79 is printed and sintered preferably at a temperature of 1100° C. to 1350° C. The upper electrode 75 can be sintered preferably at a temperature of 500° C. to 900° C. to form the piezoelectric/electrostrictive device 78. Thereafter, an electrode lead for connecting the electrode film to a driving circuit may be printed and sintered.

It is to be noted that a step of repeating the printing of the first (lower) piezoelectric/electrostrictive film 79, the printing of the intermediate electrode film 73, and the sintering is performed m times. Accordingly, the piezoelectric/electrostrictive film type actuator 21 includes two layers of piezoelectric/electrostrictive films 79. On the other hand, it is also possible to form the piezoelectric/electrostrictive film type actuator including m+1 layers of piezoelectric/electrostrictive films 79. At this time, after finishing the repeating step, a sintering temperature Tm1 of the intermediate electrode film 73 after the printing is preferably lower than the sintering temperature Tm2 of the piezoelectric/electrostrictive film 79 formed last (in the upper part) by 0° C. to 300° C.

This is because the piezoelectric/electrostrictive film 79 formed last (in the upper part) is sintered only once at the sintering temperature Tm2, whereas the piezoelectric/electrostrictive film 79 formed in the middle is sintered many times at the sintering temperature Tm1 and thereafter sintered once at the sintering temperature Tm2. Therefore, when the sintering temperature Tm1 is set to be lower than the sintering temperature Tm2, the sintering degree of each piezoelectric/electrostrictive film can be more uniform.

Figure 27:
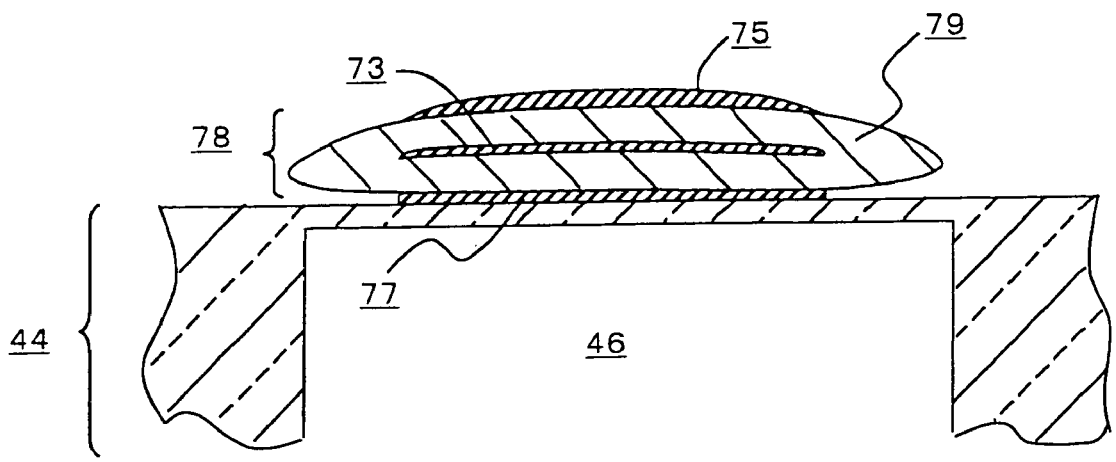
FIG. 27 is a diagram showing one embodiment of the piezoelectric/electrostrictive film type actuator according to the present invention, and is a sectional view showing one actual shape example of the embodiment corresponding to FIG. 8.
Figure 28:
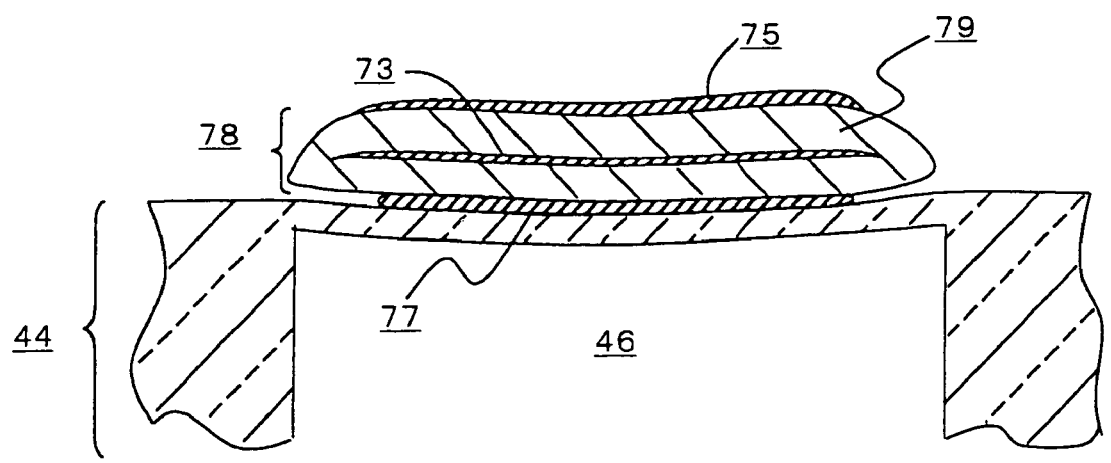
FIG. 28 is a diagram showing one embodiment of the piezoelectric/electrostrictive film type actuator of the present invention, and is a sectional view showing another actual shape example of the embodiment corresponding to FIG. 8.

It is to be noted that in FIG. 8, in one embodiment of the piezoelectric/electrostrictive film type actuator of the present invention obtained in this manner, a sectional view seen from the short-side direction of the piezoelectric/electrostrictive film is schematically shown. Especially when the screen print method is used to manufacture the piezoelectric/electrostrictive film type actuator of the present invention, by the fluidity of the paste of the piezoelectric/electrostrictive material in the screen print step, concretely as shown in FIG. 27, a mode is obtained in which the film thickness is thinned closer to the pattern end of the short-side direction. Since the piezoelectric/electrostrictive film 79 contracts in the short-side direction during the sintering step, the middle portion of the closing plate 166 sometimes has a shape that is bent in the direction of the cavity 46, as shown in FIG. 28.

Figure 29:
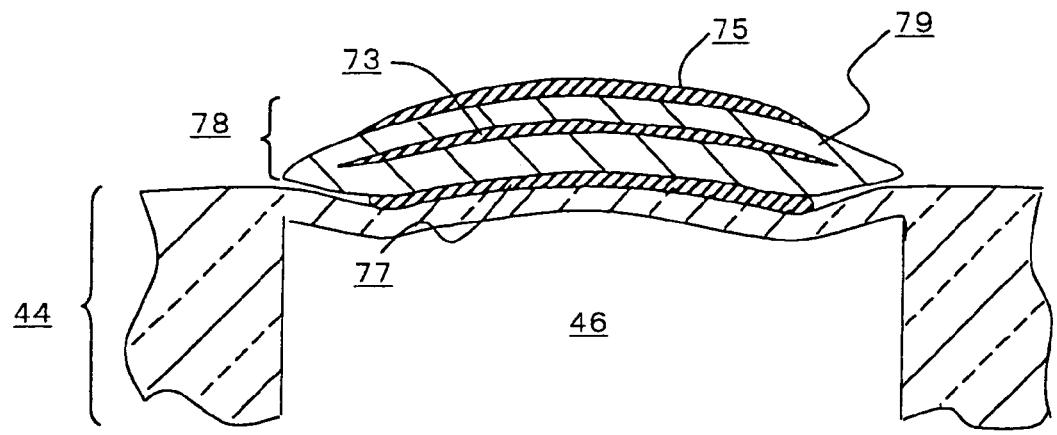
FIG. 29 is a diagram showing one embodiment of the piezoelectric/electrostrictive film type actuator of the present invention, and is a sectional view showing another actual shape example of the embodiment corresponding to FIG. 8.

It is to be noted that sintering shrinkage start timing of the upper and lower piezoelectric/electrostrictive films 79, a sintering shrinkage amount, and the shape of the closing plate 166 are adjusted. Accordingly, the closing plate 166 can be formed in a W shape as shown in FIG. 29, but in this shape, the flexural displacement is easily developed as compared with a simple shape shown in FIG. 28. The reason is not exactly known, but the strain at the time of the sintering shrinkage of the piezoelectric/electrostrictive film is easily released, and residual stress that otherwise deteriorates the characteristics of the piezoelectric/electrostrictive material is reduced. This possibility is considered.

Moreover, the thickness $t_n$ of the n-th formed piezoelectric/electrostrictive film ($n \geq 2$) preferably satisfies the following equation: $t_n \leq t_{n-1} \times 0.95$.

When the gradually thin piezoelectric/electrostrictive film is formed and laminated in this manner, the piezoelectric/electrostrictive film formed in the upper part can be distorted more largely than the piezoelectric/electrostrictive film formed in the lower part. The bend efficiency can be enhanced, and the flexural displacement can more effectively be developed.

Figure 30:
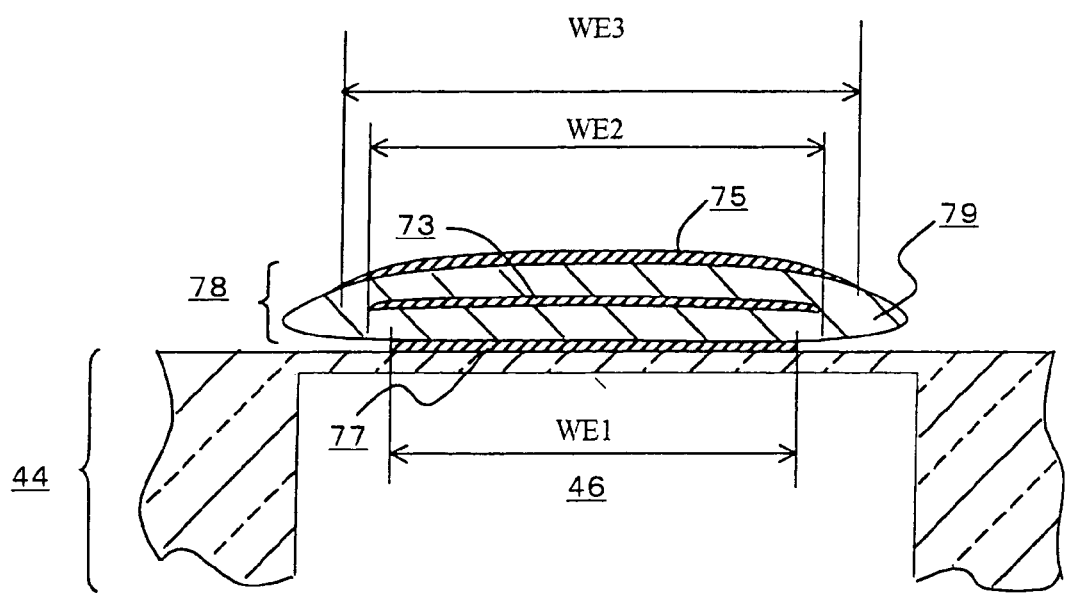
FIG. 30 is a diagram showing one embodiment of the piezoelectric/electrostrictive film type actuator of the present invention, and is a sectional view seen from the short-side direction of the piezoelectric/electrostrictive film showing the actual shape example.

When the dimension of the piezoelectric/electrostrictive film 79 in the short-side direction is as small as 200 μm or less, as shown in FIG. 30, the width of the electrode layer is increased toward the upper layer from the lower layer. Even in this case, the piezoelectric/electrostrictive film formed in the upper part can still be distorted more largely than the piezoelectric/electrostrictive film formed in the lower part. The bend efficiency can be enhanced, and the flexural displacement can more effectively be developed (WE1<WE2<WE3 in FIG. 30). The width increase amount is preferably optimized in consideration of an electric field distribution, and is, for example, preferably about twice the layer thickness of the piezoelectric/electrostrictive film 79 in the lower and upper layers.

Figure 31:
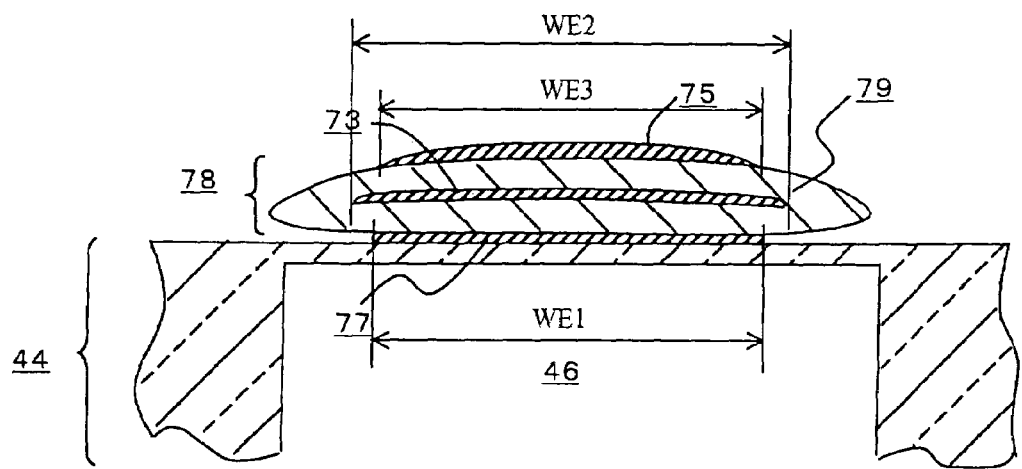
FIG. 31 is a diagram showing one embodiment of the piezoelectric/electrostrictive film type actuator of the present invention, and is a sectional view seen from the short-side direction of the piezoelectric/electrostrictive film showing another actual shape example.
Figure 32:
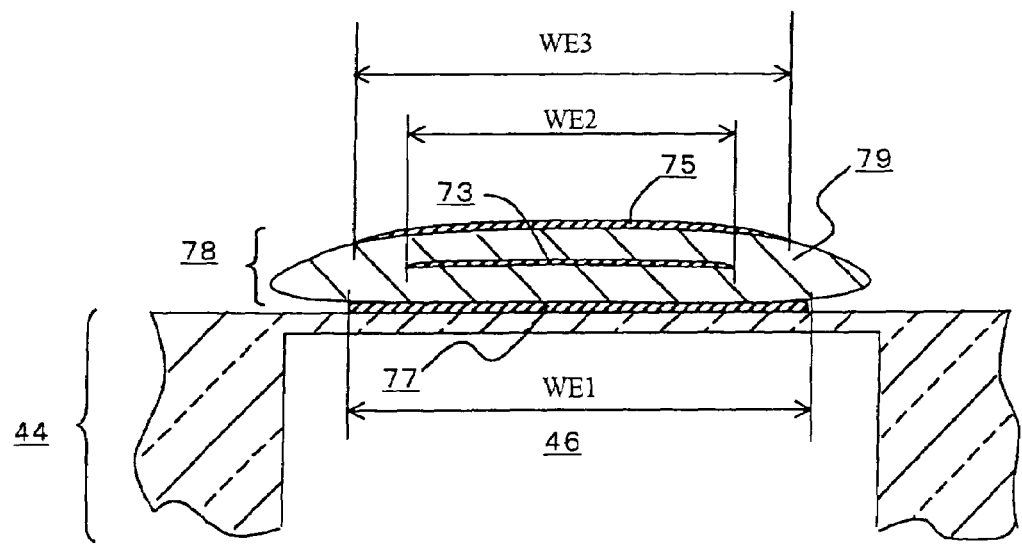
FIG. 32 is a diagram showing one embodiment of the piezoelectric/electrostrictive film type actuator of the present invention, and is a sectional view seen from the short-side direction of the piezoelectric/electrostrictive film showing still another actual shape example.

Additionally, when the driving voltage of the piezoelectric/electrostrictive film type actuator is raised to obtain a large flexural displacement, as shown in FIGS. 31, 32, the difference between the width of the electrode film 73 and the width of the electrode films 75, 77 is preferably changed (WE1, WE3<WE2 in FIG. 31, WE2<WE1, WE3 in FIG. 32). This has an effect of avoiding the addition of the electric field in the vicinity of the end of the short-side direction in which the layer thickness of the piezoelectric/electrostrictive film 79 is easily reduced.

Moreover, since the appropriate material is selected, each electrode film and piezoelectric/electrostrictive film of the piezoelectric/electrostrictive device and an electrode lead are successively printed, and can thereafter be sintered integrally once. On the other hand, after forming the piezoelectric/electrostrictive film, each electrode can also be disposed at low temperature. When the material is selected, the piezoelectric/electrostrictive film and/or the electrode film can be sintered the desired number of times at arbitrary times from when the first electrode film is formed until the last electrode film is formed regardless of the above-described example.

Moreover, it is also preferable to form the piezoelectric/electrostrictive device beforehand in the green sheet laminate and simultaneously sinter the green sheet laminate and piezoelectric/electrostrictive device. In the simultaneous sintering, all the constituting films of the piezoelectric/electrostrictive device may also be sintered. Alternatively, the example includes various methods such as a method of simultaneously sintering only the lower electrode and green sheet laminate and a method of sintering the constituting films other than the upper electrode simultaneously with the green sheet laminate. Examples of the method of sintering the piezoelectric/electrostrictive device simultaneously with the green sheet laminate include a press molding method using a metal mold and a method of molding the piezoelectric/electrostrictive film by a tape molding method using a slurry material, laminating the piezoelectric/electrostrictive film onto the green sheet laminate by heat pressing before the sintering, and simultaneously sintering the film and laminate to simultaneously prepare the ceramic substrate and piezoelectric/electrostrictive film. Additionally, in this method, the above-described film forming method needs to be used to form the electrode in the piezoelectric/electrostrictive film beforehand. The electrode and piezoelectric/electrostrictive film which are constituting layers of the piezoelectric/electrostrictive device can be formed in the green sheet laminate by screen printing, and can simultaneously be sintered.

The sintering temperature of the piezoelectric/electrostrictive film is appropriately determined by the material constituting the film, but is 800° C. to 1400° C. in general, and preferably 1100° C. to 1350° C. In this case, in order to control the composition of the piezoelectric/electrostrictive film, the film is preferably sintered under the presence of an evaporation source of the material of the piezoelectric/electrostrictive film. It is to be noted that when the piezoelectric/electrostrictive film and green sheet laminate are simultaneously sintered, both sintering conditions need to be unified.

It is to be noted that the piezoelectric/electrostrictive film type actuator of the present invention can also be prepared by the methods other than the preparing method using the above-described green sheet, such as a pressurizing molding method or cast molding method using a molding die, injection molding method, and photolithography. A method of bonding members which have been separately prepared and which are constituting elements to prepare the actuator is also possible. However, productivity is low. Additionally, there is also a problem in the reliability because problems such as breakage in the bond portion easily occur.

INDUSTRIAL APPLICABILITY

According to the present invention, the problem of a conventional piezoelectric/electrostrictive film type actuator can be solved. That is, a superior piezoelectric/electrostrictive film type actuator is provided which does not include a structure laminated using an adhesive, which can easily highly be integrated, in which a larger displacement is obtained with the same driving voltage and which is high in response speed and large in generation force.

This piezoelectric/electrostrictive film type actuator can be used as a displacement control device, solid device motor, ink jet head, relay, switch, shutter, pump, fin, and the like, and can preferably be used especially as an ink pump of a print head for use in an ink jet printer.

The invention claimed is:

1. A piezoelectric/electrostrictive film type actuator comprising:

a ceramic substrate comprising a plurality of laminated thin plate layers and having a cavity formed in an internal portion thereof; and a piezoelectric/electrostrictive device disposed on one surface of said ceramic substrate and including a plurality of piezoelectric/electrostrictive films and electrode films;

wherein said piezoelectric/electrostrictive films and said electrode films are alternately laminated such that electrode films form uppermost and lowermost layers of said piezoelectric/electrostrictive device;

wherein said actuator is driven by displacement of said piezoelectric/electrostrictive device such that said uppermost electrode film moves and said cavity is pressurized by deforming a part of a wall thereof with said piezoelectric/electrostrictive device;

wherein a thickness of said piezoelectric/electrostrictive device, when viewed in cross-section, decreases from a central portion thereof toward opposite outer portions thereof; and wherein an upper surface of said piezoelectric/electrostrictive device, when viewed in cross-section, has a convex arcuate shape, and a radius of curvature of said convex arcuate shape originates from a point located below said one surface of ceramic substrate.

2. The piezoelectric/electrostrictive film type actuator according to claim 1, wherein said piezoelectric/electrostrictive device includes two to four layers of said piezoelectric/electrostrictive films.

3. The piezoelectric/electrostrictive film type actuator according to claim 1, wherein a per layer thickness of said piezoelectric/electrostrictive films is 30 μm or less.

4. The piezoelectric/electrostrictive film type actuator according to claim 1, wherein at least one layer of said piezoelectric/electrostrictive films is formed by electrophoresis deposition.

5. The piezoelectric/electrostrictive film type actuator according to claim 1, comprising two or more of said piezoelectric/electrostrictive devices disposed on said ceramic substrate.

6. The piezoelectric/electrostrictive film type actuator according to claim 1, wherein said ceramic substrate comprises two or three laminated thin plate layers.

7. The piezoelectric/electrostrictive film type actuator according to claim 1, wherein a thickness of a thinner portion of said ceramic substrate is 50 μm or less.

8. The piezoelectric/electrostrictive film type actuator according to claim 1, wherein said ceramic substrate comprises a material selected from the group consisting of materials containing zirconium oxide, aluminum oxide, magnesium oxide, aluminum nitride, and silicon nitride as a major component.

9. The piezoelectric/electrostrictive film type actuator according to claim 1, wherein said ceramic substrate comprises a material containing either partially stabilized zirconium oxide or completely stabilized zirconium oxide as a major component.

10. An ink pump of a printer head disposed in an ink jet printer comprising the piezoelectric/electrostrictive film type actuator according to claim 1.

11. A piezoelectric/electrostrictive film type actuator comprising:

a ceramic substrate; and a piezoelectric/electrostrictive device disposed on said ceramic substrate and including a plurality of piezoelectric/electrostrictive films and electrode films;

wherein said piezoelectric/electrostrictive films and said electrode films are alternately laminated such that electrode films form uppermost and lowermost layers of said piezoelectric/electrostrictive device;

wherein a thickness $t_n$ of an n-th piezoelectric/electrostrictive film from the bottom of said piezoelectric/electrostrictive device satisfies the following equation: $t_n \leq t_{n-1} \times 0.95$; and wherein said actuator is driven by displacement of said piezoelectric/electrostrictive device.

12. A piezoelectric/electrostrictive film type actuator comprising:

a ceramic substrate having a cavity formed in an internal portion thereof; and a piezoelectric/electrostrictive device disposed on one surface of said ceramic substrate and including a plurality of piezoelectric/electrostrictive films and electrode films;

wherein an uppermost one of said electrode films moves and said cavity is pressurized by deforming a part of a wall thereof with said piezoelectric/electrostrictive device; and wherein said piezoelectric/electrostrictive film type actuator is formed by a method comprising the steps of:

preparing a green sheet laminate including at least one green sheet as a substrate and one or more green sheets each having at least one hole portion formed therein;

sintering said green sheet laminate to obtain a ceramic laminate;

forming an electrode film (A) on an outer surface of said ceramic laminate by a first film forming method;

forming a piezoelectric/electrostrictive film (A) on said electrode film (A) by a second film forming method;

forming an electrode film (B) on said piezoelectric/electrostrictive film (A) by said first film forming method;

repeating the steps of forming said piezoelectric/electrostrictive film (A) and electrode film (B) one or more times;

forming a piezoelectric/electrostrictive film (B) on said electrode film (B) by said second film forming method;

forming an electrode film (C) on said piezoelectric/electrostrictive film (B) by said first film forming method; and sintering said piezoelectric/electrostrictive films and/or said electrode films a predetermined number of times at arbitrary times between said step of forming said electrode film (A) and said step of forming said electrode film (C).

13. The piezoelectric/electrostrictive film type actuator according to claim 12, wherein said step of forming said electrode film (B) includes sintering said electrode film (B) at a sintering temperature of Tm1 (° C.), and wherein said step of forming said piezoelectric/electrostrictive film (B) includes sintering said piezoelectric/electrostrictive film (B) at a sintering temperature of Tm2 (° C.), such that the following equation is satisfied:

$$0 \leq Tm2 - Tm1 \leq 300.$$

14. The piezoelectric/electrostrictive film type actuator according to claim 12, wherein said first and said second film forming methods each comprise at least one of a plurality of film forming methods, such that each of said electrode films and each of said piezoelectric/electrostrictive films are formed by the same or a different film forming method.

15. The method according to claim 14, wherein said first and said second film forming methods are the same.

16. The piezoelectric/electrostrictive film type actuator according to claim 12, wherein said first and said second film forming methods each comprise at least one thick film forming method selected from the group consisting of screen printing, dipping, coating, and electrophoresis deposition.

17. The piezoelectric/electrostrictive film type actuator according to claim 12, wherein said second film forming method comprises screen printing to form a first piezoelectric/electrostrictive film, and electrophoresis deposition to form second and subsequent piezoelectric/electrostrictive films.

18. The piezoelectric/electrostrictive film type actuator according to claim 12, wherein said step of forming said green sheet laminate comprises laminating two or three green sheets each having at least one hole portion formed therein.

19. An ink pump of a printer head disposed in an ink jet printer comprising the piezoelectric/electrostrictive film type actuator according to claim 12.

20. A piezoelectric/electrostrictive film type actuator comprising:
a ceramic substrate having a cavity formed in an internal portion thereof; and
a piezoelectric/electrostrictive device disposed on said ceramic substrate and including a plurality of piezoelectric/electrostrictive films and electrode films;
wherein said cavity is pressurized by deforming a part of a wall thereof with said piezoelectric/electrostrictive device; and
wherein said piezoelectric/electrostrictive film type actuator is formed by a method comprising the steps of:
preparing a green sheet laminate including at least one green sheet as a substrate and one or more green sheets each having at least one hole portion formed therein;
sintering said green sheet laminate to obtain a ceramic laminate;
forming an electrode film (A) on an outer surface of said ceramic laminate by a first film forming method;
forming a piezoelectric/electrostrictive film (A) on said electrode film (A) by a second film forming method;
forming an electrode film (B) on said piezoelectric/electrostrictive film (A) by said first film forming method;
repeating the steps of forming said piezoelectric/electrostrictive film (A) and electrode film (B) one or more times;
forming a piezoelectric/electrostrictive film (B) on said electrode film (B) by said second film forming method;
forming an electrode film (C) on said piezoelectric/electrostrictive film (B) by said first film forming method; and
sintering said piezoelectric/electrostrictive films and/or said electrode films a predetermined number of times at arbitrary times between said step of forming said electrode film (A) and said step of forming said electrode film (C);
wherein a thickness $t_n$ of an n-th piezoelectric/electrostrictive film satisfies the following equation: $t_n \leq t_{n-1} \times 0.95$.

21. A method of manufacturing a piezoelectric/electrostrictive film type actuator comprising a ceramic substrate having a cavity formed in an internal portion thereof, and a piezoelectric/electrostrictive device disposed on one surface of said ceramic substrate and including a plurality of piezoelectric/electrostrictive films and electrode films, wherein an uppermost one of said electrode films moves and said cavity is pressurized by deforming a part of a wall thereof with said piezoelectric/electrostrictive device, said method comprising the steps of:
A) preparing a green sheet laminate including at least one green sheet as a substrate and at least one green sheet having at least one hole portion formed therein and sintering said green sheet laminate to obtain a ceramic laminate;
B) forming an electrode film (A) on an outer surface of said ceramic laminate by a first film forming method;
C) forming a piezoelectric/electrostrictive film (A) on said electrode film (A) by a second film forming method;
D) forming an electrode film (B) on said piezoelectric/electrostrictive film (A) by said first film forming method;
E) repeating steps C and D one or more times;
F) forming a piezoelectric/electrostrictive film (B) on said electrode film (B) by said second film forming method; and
G) forming an electrode film (C) on said piezoelectric/electrostrictive film (B) by said first film forming method;
wherein said piezoelectric/electrostrictive film and/or said electrode films are sintered a predetermined number of times at arbitrary times between said electrode film (A) is formed in step B and said electrode film (C) is formed in step G.

22. The method according to claim 21, wherein said step D includes sintering said electrode film (B) at a sintering temperature of Tm1 (° C.), and wherein said step F includes sintering said piezoelectric/electrostrictive film (B) at a sintering temperature of Tm2 (° C.), such that the following equation is satisfied: $0 \leq Tm2-Tm1 \leq 300$.

23. The method according to claim 21, wherein said first film and said second forming methods each comprise at least one of a plurality of film forming methods such that each of said electrode films and each of said piezoelectric/electrostrictive films are formed by the same or a different film forming method in the respective steps.

24. The method according to claim 23, wherein said first and said second film forming methods are the same.

25. The method according to claim 21, wherein said first and said second film forming methods each comprise at least one thick film forming method selected from the group consisting of screen printing, dipping, coating, and electrophoresis deposition.

26. The method according to claim 21, wherein said second film forming method comprises screen printing to form a first piezoelectric/electrostrictive film and electrophoresis deposition to form second and subsequent piezoelectric/electrostrictive films.

27. The method according to claim 21, wherein each of said at least one laminated green sheets of step A that form said substrate have at least one hole portion formed therein.

28. The method according to claim 27, wherein said at least one laminated green sheet comprises two or three laminated green sheets.

29. An ink pump of a printer head disposed in an ink jet printer comprising an actuator formed according to the method of claim 21.

30. A method of manufacturing a piezoelectric/electrostrictive film type actuator comprising a ceramic substrate having a cavity formed in an internal portion thereof, and a piezoelectric/electrostrictive device disposed on said ceramic substrate and including a plurality of piezoelectric/electrostrictive film and electrode film, wherein said cavity is pressurized by deforming a part of a wall thereof with said piezoelectric/electrostrictive device, said method comprising the steps of:

A) preparing a green sheet laminate including at least one green sheet as a substrate and at least one green sheet having at least one hole portion formed therein and sintering said green sheet laminate to obtain a ceramic laminate;

B) forming an electrode film (A) on an outer surface of said ceramic laminate by a first film forming method;

C) forming a piezoelectric/electrostrictive film (A) on said electrode film (A) by a second film forming method;

D) forming an electrode film (B) on said piezoelectric/electrostrictive film (A) by said first film forming method;

E) repeating steps C and D one or more times;

F) forming a piezoelectric/electrostrictive film (B) on said electrode film (B) by said second film forming method; and G) forming an electrode film (C) on said piezoelectric/electrostrictive film (B) by said first film forming method;

wherein said piezoelectric/electrostrictive films and/or said electrode films are sintered a predetermined number of times at arbitrary times between said electrode film (A) is formed in step B and said electrode film (C) is formed in step G; and wherein a thickness $t_n$ of an n-th piezoelectric/electrostrictive film satisfies the following equation: $t_n \leq t_{n-1} \times 0.95$.

* * * * *

UNITED STATES PATENT AND TRADEMARK OFFICE
CERTIFICATE OF CORRECTION

| | | |
|---|---|---|
| PATENT NO. | : 7,044,586 B2 | Page 1 of 1 |
| APPLICATION NO. | : 10/657842 | |
| DATED | : May 16, 2006 | |
| INVENTOR(S) | : Yukihisa Takeuchi, Nobuo Takahashi and Mutsumi Kitagawa | |

It is certified that error appears in the above-identified patent and that said Letters Patent is hereby corrected as shown below:

On Title Page (item 56)

FOREIGN PATENT DOCUMENTS

*Please add*:

EP  0 709 195 A1   5/1996
EP  0 858 894 A2   8/1998
EP  0 969 530 A2   1/2000
EP  1 029 679 A1   8/2000

Signed and Sealed this

Twenty-eighth Day of November, 2006

JON W. DUDAS
*Director of the United States Patent and Trademark Office*